(12) United States Patent
Mauder et al.

(10) Patent No.: US 7,943,449 B2
(45) Date of Patent: May 17, 2011

(54) SEMICONDUCTOR COMPONENT STRUCTURE WITH VERTICAL DIELECTRIC LAYERS

(75) Inventors: Anton Mauder, Kolbermoor (DE);
Stefan Sedlmaier, Munich (DE); Ralf Erichsen, Falkenstein (DE); Hans Weber, Bayerisch Gmain (DE); Oliver Haeberlen, Villach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 126 days.

(21) Appl. No.: 12/241,828

(22) Filed: Sep. 30, 2008

(65) Prior Publication Data
US 2010/0078713 A1 Apr. 1, 2010

(51) Int. Cl.
*H01L 21/336* (2006.01)
*H01L 21/8234* (2006.01)

(52) U.S. Cl. ........ 438/197; 438/510; 438/700; 438/733; 257/E21.051; 257/E21.237; 257/E21.267; 257/E21.304; 257/E21.32; 257/E21.396; 257/E21.431

(58) Field of Classification Search .......... 438/197, 438/311, 369, 501, 505, 508, 510, 692, 700, 438/733, 740, 752, 786; 257/E21.051, 237, 257/267, 304, 32, 396, 421
See application file for complete search history.

(56) References Cited

U.S. PATENT DOCUMENTS

| | | | |
|---|---|---|---|
| 5,008,208 A | 4/1991 | Liu et al. | |
| 5,212,110 A | 5/1993 | Pfiester et al. | |
| 5,494,837 A | 2/1996 | Subramanian et al. | |
| 5,994,718 A | 11/1999 | Demirlioglu | |
| 6,018,174 A * | 1/2000 | Schrems et al. | 257/296 |
| 6,124,612 A | 9/2000 | Tihanyi et al. | |
| 6,184,107 B1 * | 2/2001 | Divakaruni et al. | 438/427 |
| 7,015,145 B2 | 3/2006 | Jaiprakash et al. | |
| 2005/0045996 A1 | 3/2005 | Yamauchi et al. | |
| 2005/0167744 A1 | 8/2005 | Yilmaz | |
| 2007/0023830 A1 * | 2/2007 | Pfirsch et al. | 257/341 |
| 2008/0197441 A1 | 8/2008 | Mauder et al. | |
| 2009/0046493 A1 | 2/2009 | Assefa et al. | |
| 2009/0218621 A1 | 9/2009 | Pfirsch et al. | |
| 2009/0325361 A1 | 12/2009 | Mauder et al. | |

FOREIGN PATENT DOCUMENTS

| | | |
|---|---|---|
| DE | 19801313 | 7/1999 |
| DE | 102005035153 | 2/2007 |
| DE | 102005039331 | 2/2007 |
| DE | 102007004320 | 7/2008 |
| WO | 2007012490 | 2/2007 |

OTHER PUBLICATIONS

Bell, T.E. et al., "Porous Silicon as a Sacrificial Material," Micromech. Microeng., vol. 6, pp. 361-369 (1996).
Siffert, P. et al., "Silicon-Evolution and Future of a Technology," Springer Berlin Heidelberg New York, pp. 159-167.
Goesele, U. et al., Excerpt of "Science and Technology of Semiconductor Wafer Bonding," Max-Planck-Institute of Microstructure Physics, Halle & School of Engineering, Duke University, Durham, North Carolina, pp. 1. <http://www.duke.edu/web/wbl/ch7/ch7-hpge.html#7.3.1.5>.

* cited by examiner

*Primary Examiner* — David Nhu

(74) *Attorney, Agent, or Firm* — Dicke, Billig & Czaja, PLLC

(57) ABSTRACT

A method for producing a semiconductor structure and a semiconductor component are described.

20 Claims, 16 Drawing Sheets

B-B

SEMICONDUCTOR COMPONENT STRUCTURE WITH VERTICAL DIELECTRIC LAYERS

BACKGROUND

One aspect in the development of power semiconductor components is to achieve a lowest possible on resistance for a given voltage blocking capability. Power semiconductor components, such as power MOSFETs, for example, have a drift zone, in which, with the component in the off state and a reverse voltage present, a space charge zone propagates and which accepts the reverse voltage in this way. The on resistance of the component is dependent, inter alia, on a doping concentration of the drift zone.

In order to reduce the on resistance, a drift control zone can be provided adjacent to the drift zone, which drift control zone is dielectrically insulated from the drift zone using a dielectric layer and serves to control a conductive channel in the drift zone along the dielectric layer.

SUMMARY

One aspect of the present description relates to a method for producing a semiconductor structure, the method including: providing a first semiconductor body having a first and a second side, the semiconductor body having a plurality of first dielectric layers being arranged at a distance from one another, each of which extending into the first semiconductor body proceeding from the first side in a vertical direction, and subdividing the first semiconductor body into semiconductor sections; applying a second semiconductor body to the first side of the first semiconductor body; reducing a thickness of the first semiconductor body in a vertical direction proceeding from the second side at least as far as the level of the first dielectric layers.

A further aspect relates to a semiconductor component, including: a semiconductor body having a first and a second side, an edge and an edge region adjacent to the edge in a lateral direction; a drift zone and a drift control zone, which are dielectrically insulated from one another using a first dielectric layer extending in a perpendicular direction of the semiconductor body, wherein at least the drift control zone is dielectrically insulated from the edge region using a second dielectric layer; a first connection zone in the region of the second side of the semiconductor body, which makes contact with the drift zone and the edge zone; a third dielectric layer, which is arranged between the drift zone and the connection zone; a rectifier element, which is connected between a contact zone of the drift control zone in the region of the first side and a contact zone of the edge region in the region of the first side.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
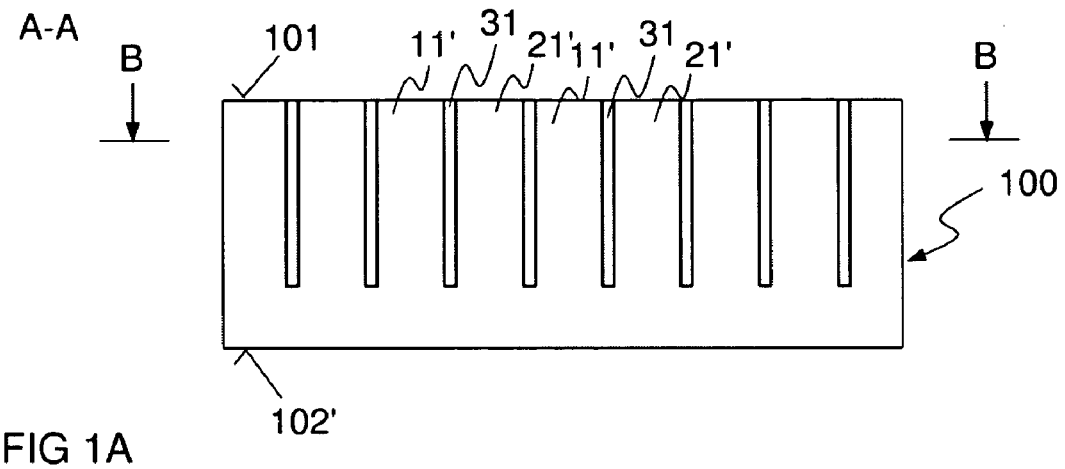
FIG. 1 illustrates one embodiment of a method for producing a semiconductor component structure having semiconductor sections, and dielectric layers arranged between the semiconductor sections a, on the basis of vertical cross sections through a semiconductor body structure during individual processes.

One embodiment of a method for producing a semiconductor component structure having semiconductor sections, that are separated by first dielectric layers is explained below with reference to FIGS. 1A to 1C. Referring to FIG. 1A, in this method a first semiconductor body 100 is provided that is, for example, composed of silicon, and which has a first side 101, a second side 102' remote from the first side 101, and also vertical first dielectric layers 31 which extend into the semiconductor body 100 proceeding from the first side 101 in a vertical direction. FIG. 1A illustrates an excerpt from a vertical cross section through this first semiconductor body 100, that is to say a cross section in a vertical sectional plane running perpendicular to the first and second sides 101, 102'.

In the embodiment illustrated in FIG. 1A, the first dielectric layers 31 run perpendicular relative to the first side 101. It should be pointed out in this connection that "vertical dielectric layers" in connection with the present description should also be understood to mean those dielectric layers which run obliquely relative to the first side 101, that is to say which only have one direction component running in a vertical direction of the first semiconductor body 100.

The individual first dielectric layers 31 subdivide the first semiconductor body 100 in a lateral direction, that is to say in a direction running perpendicular to the vertical direction, into semiconductor sections 11', 21'. Two of these semiconductor sections are adjacent to—or separated by—one dielectric layer. These two semiconductor sections that are separated by one dielectric layer will be referred to as first and second semiconductor sections 11', 21' in the following. The first and second semiconductor sections can be processed identically or differently in the following processes. At the time of the method process of FIG. 1A the first and second semiconductor sections 11', 21' can be identical semiconductor zones, that is to say they do not differ with regard to doping type and doping concentration.

In the embodiment illustrated in FIG. 1A, the individual first dielectric layers 31 are spaced apart uniformly, such that the first sections 11' and the second sections 21' have identical dimensions in a direction perpendicular to the first dielectric layers 31. In a manner not specifically illustrated, there is also the possibility of producing the first sections 11' and the second sections 21' with different horizontal dimensions.

Figure 3A:
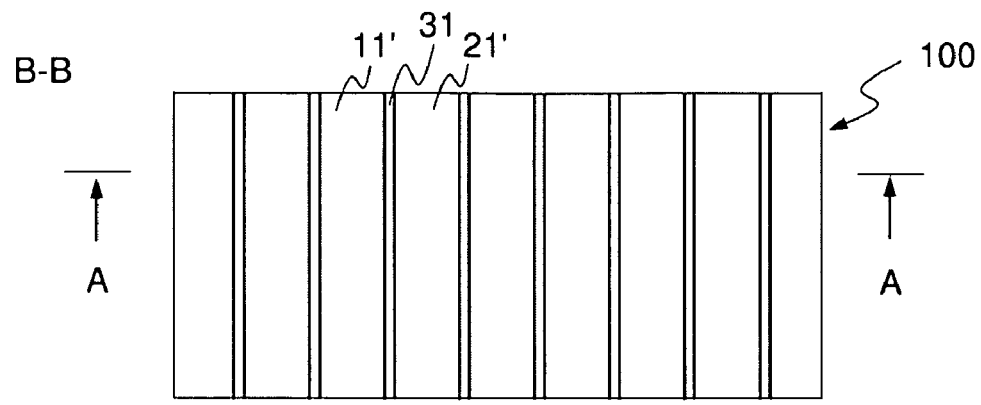
FIG. 3 illustrates a semiconductor component structure including strip-type semiconductor sections on the basis of horizontal cross sections through a semiconductor body structure.

Referring to FIG. 3A, which illustrates a cross section through the first semiconductor body 100 in a horizontal sectional plane B-B depicted in FIG. 1A, the individual dielectric layers 31 can be realized as elongated dielectric layers in a lateral direction, which are arranged at least approximately parallel to one another. The first sections 11' and the second sections 21' are then in strip form in a horizontal direction of the first semiconductor body 100.

Figure 3B:
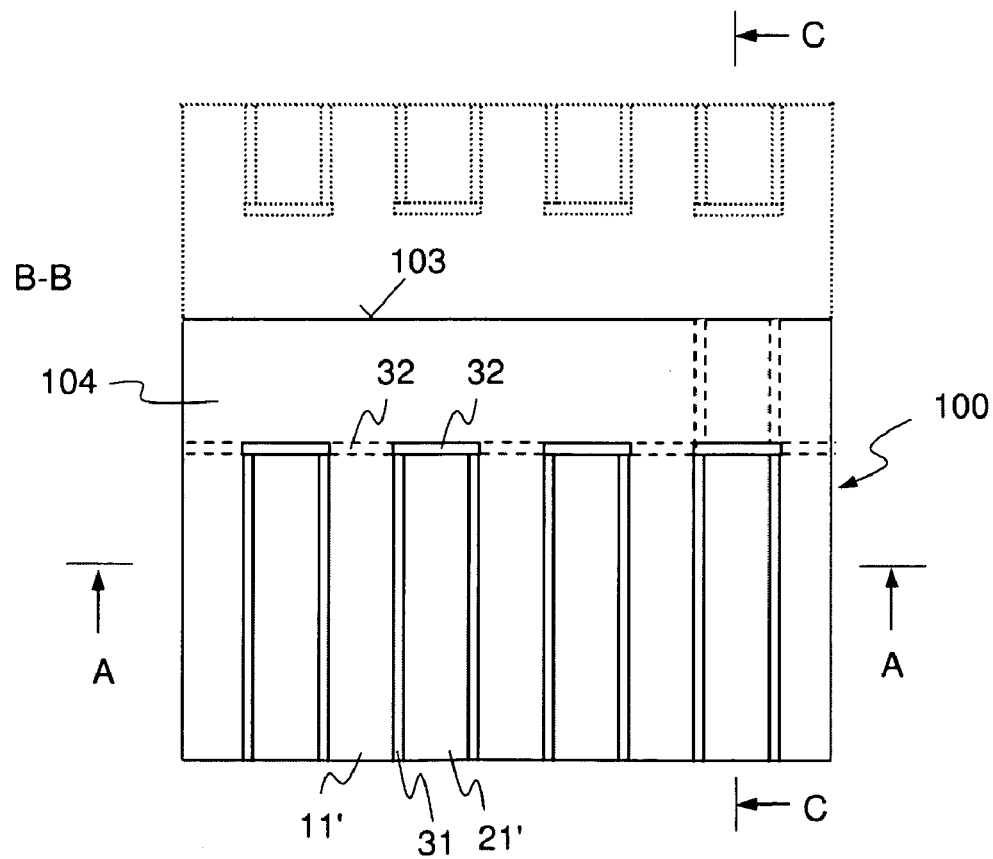

Referring to FIG. 3B, the first semiconductor body 100 has an edge 103 that delimits the first semiconductor body 100 in a lateral direction. A region of the semiconductor body 100 that is adjacent to the edge 103 in a lateral direction is referred to hereinafter as edge region 104 of the semiconductor body 100. The semiconductor body 100 can be circular or rectangular in plan view or in the horizontal plane. FIG. 3B illustrates an excerpt from the first semiconductor body 100 in the horizontal sectional plane B-B in the region of the edge 103 for the case where the semiconductor body is a rectangular semiconductor body.

The dielectric layers 31 can reach as far as the edge 103 in a lateral direction of the semiconductor body, as is illustrated by dashed lines on the right in FIG. 3B. The dielectric layers 31 can, however, also end at a distance from the edge 103 in a lateral direction of the first semiconductor body 100. If the first dielectric layers 31 end at a distance from the edge 103, then second vertical dielectric layers 32 are present at least between the second sections 21' and the edge region 104, the dielectric layers extending into the first semiconductor body 100 proceeding from the first side 101 in a vertical direction in a manner corresponding to the first dielectric layers 31. Such second dielectric layers 32 can optionally also be arranged between the first sections 11' and the edge section 104, which is illustrated by dashed lines in FIG. 3B. The first and second dielectric layers 31, 32 completely enclose the second sections 21' in a lateral direction of the first semiconductor body 100.

Figure 3C:
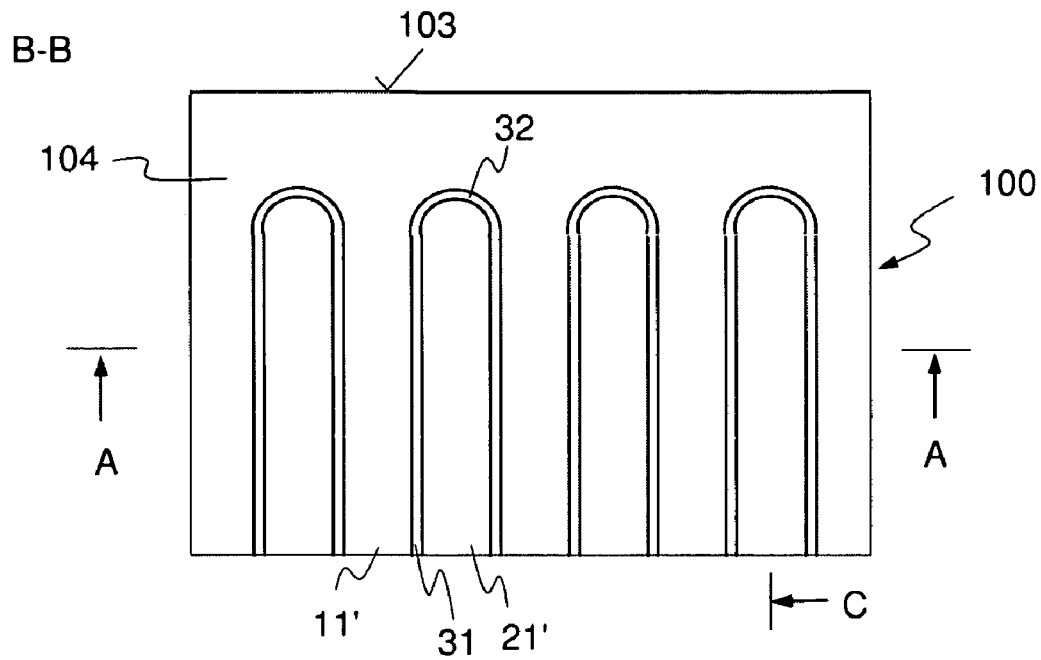
Figure 3D:
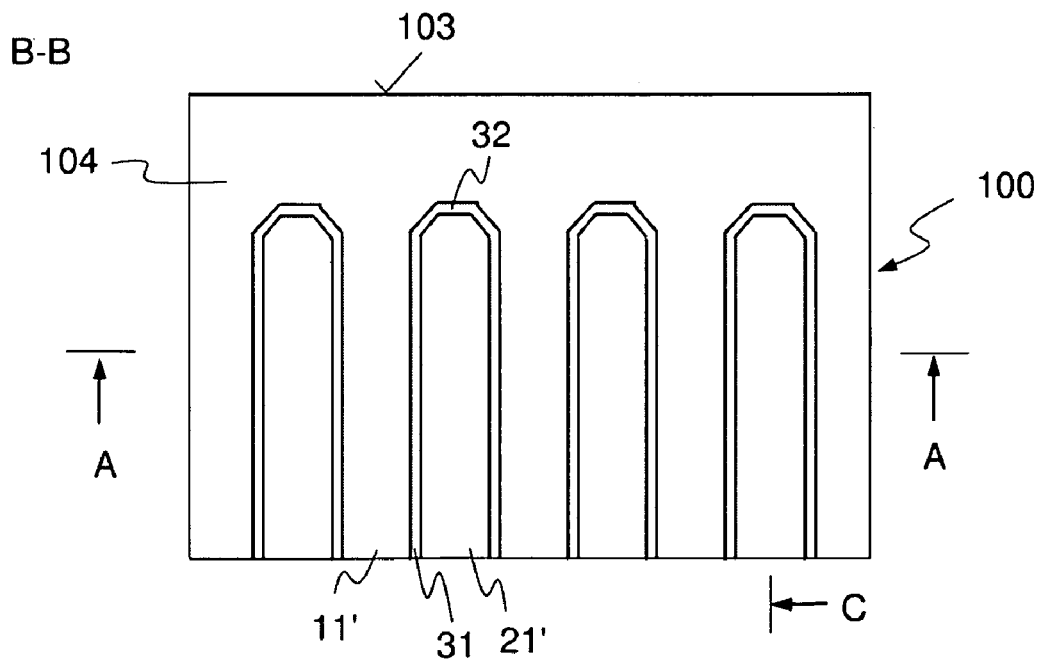

The second dielectric layers 32 can be straight in the horizontal plane and run perpendicular to the first dielectric layers 31, as is illustrated in FIG. 3B. Such an orthogonal arrangement of the second dielectric layers in relation to the first dielectric layers 31 should be understood merely as an example. Thus, the second dielectric layers can, for example, also be embodied in bent fashion, in particular in circular fashion, in the horizontal plane, as is illustrated in FIG. 3C, or can have, for example, the form of a polygon progression in the horizontal plane, as is illustrated in FIG. 3D.

During the method processes explained below, the first semiconductor body 100 can be part of a semiconductor wafer having a multiplicity of first semiconductor bodies 100 that are of identical type and are fixedly connected to one another. Such a further semiconductor body is illustrated by dashed lines in FIG. 3B. The individual semiconductor bodies can be singulated by sawing or other singulation techniques after the conclusion of the production processes explained below. At the wafer level, the edge of a semiconductor body (not yet singulated) is a line—also referred to as scribing channel or sawing track—along which the wafer is divided into individual chips or components. Edge regions of the individual semiconductor bodies are those regions which are adjacent to these dividing lines in a lateral direction. The edge is illustrated schematically as a line in FIG. 3B. In actual fact the edge usually has a certain extent, at least e.g., the width of a saw blade plus the necessary alignment tolerances for sawing.

Figure 4:
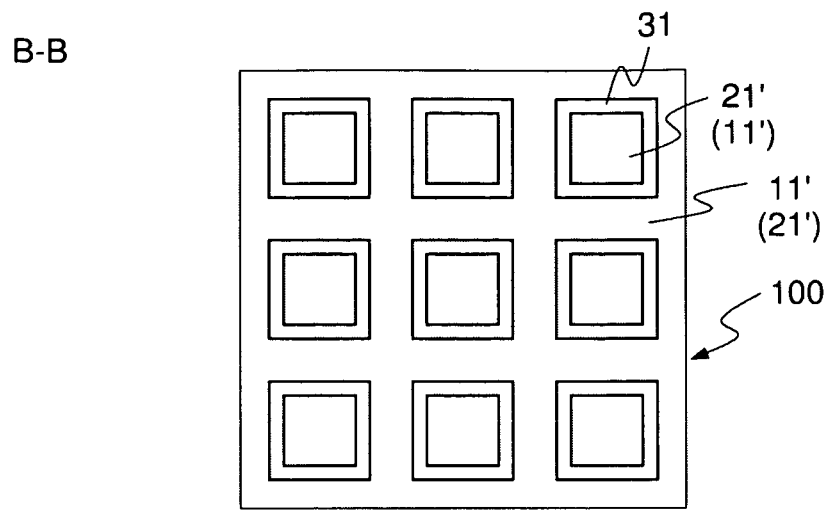
FIG. 4 illustrates a semiconductor component structure including rectangular semiconductor sections on the basis of a horizontal cross section through a semiconductor body structure.

Referring to FIG. 4, which illustrates a horizontal cross section through a first semiconductor body 100 in accordance with a further example, the first sections 11' can also have a lattice-shaped geometry and is separated from a plurality of second sections 21' in a lateral direction by the first dielectric layers 31. In the example illustrated, the first dielectric layers 31 have the geometry of a rectangular ring, but—in a manner not illustrated—can also have the geometry of an annulus, of a hexagonal ring or of an arbitrary polygonal ring. The second sections 21' correspondingly have in a horizontal direction the geometry of a rectangle, of a circle, of a hexagon or of an arbitrary polygon. It goes without saying that the second sections 21' can also have a lattice-shaped geometry, wherein the first sections 11' surrounded by the first dielectric layers 31 are arranged in interspaces of this lattice. The reference symbols indicated between parentheses in FIG. 4 relate to this last-mentioned example.

Figure 1B:
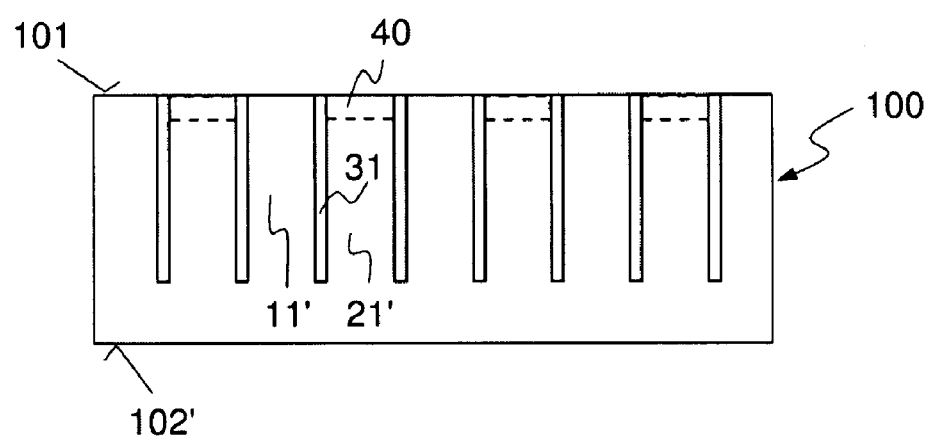

Referring to FIG. 1B, optional next method processes involve producing an insulation structure 40 (illustrated in dashed lines) in the region of the first side 101 in the second sections 21' or on the second sections 21'. The insulation structures 40 can be dielectric insulation structures including a dielectric layer, or can be junction insulation structures including a pn junction. The insulation structures 40 serve for the dielectric insulation or junction insulation of the second sections 21'.

Figure 1C:
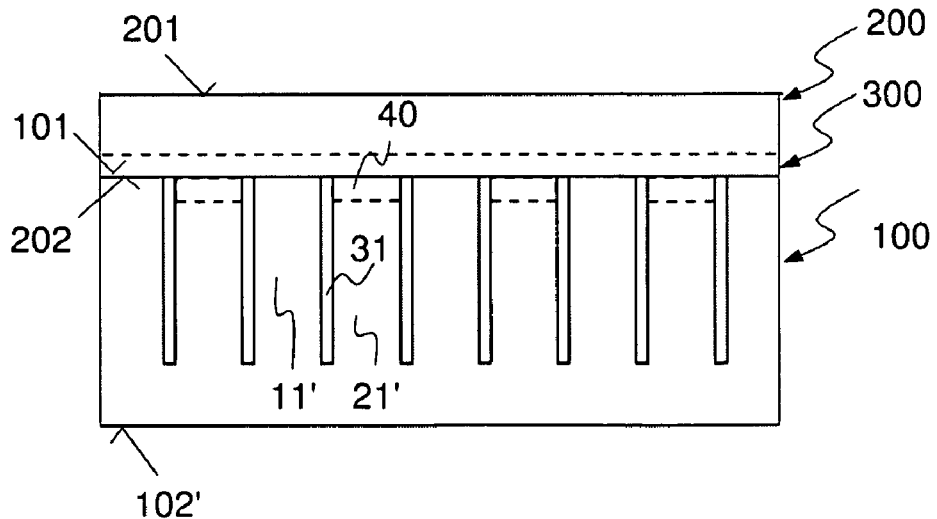

Referring to FIG. 1C, next method processes involve fixing a second semiconductor body 200 to the first semiconductor body 100 in the region of the first side 101. The second semiconductor body 200 has two sides: a first side 201; and a second side 202, which faces the first side 101 of the first semiconductor body 100. The second semiconductor body 200 can be fixed directly on the first side 101 of the first semiconductor body 100, but can also be fixed to an interlayer 300 previously applied to the first side 101 of the first semiconductor body 100. The fixing of the second semiconductor body 200 to the first semiconductor body 100 or the interlayer 300 is effected, for example, using a wafer bonding method. The second semiconductor body 200 has at least one of the functions mentioned below: it serves for mechanically stabilizing the semiconductor body structure including the first and second semiconductor bodies 100, 200 during subsequent method processes; it forms a connection zone or is part of a connection zone that makes electrically conductive contact with the drift control zone sections 11'. The second semiconductor body 200 is chosen with regard to its electrical properties in such a way that it can fulfill one or both of the functions mentioned above. It should be pointed out that the second semiconductor body need not necessarily be a homogeneous semiconductor body. Thus, the second semiconductor body can be provided with a conductive or insulating layers, for example, on one or on both sides 201 and/or 202, in respect of which examples will also be explained below.

Figure 1D:
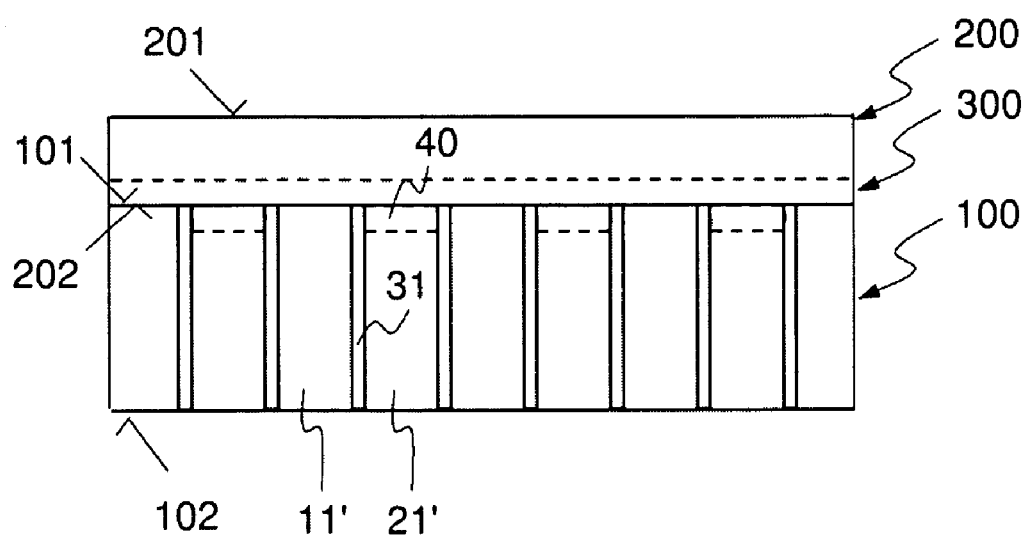

Referring to FIG. 1D, next method processes involve reducing the dimensions of the first semiconductor body 100 in a vertical direction proceeding from the second side 102', to be precise at least as far as the level of the first dielectric layers 31 or the second dielectric layers (32 in FIG. 3D, not illustrated in FIG. 1D). For this purpose, the first semiconductor body 100 is eroded proceeding from the second side 102', for example, using an etching method, a grinding method or a polishing method. It goes without saying that combinations of the methods mentioned above are also possible. In particular, a combination of a grinding or polishing method with a subsequent isotropic etch is possible. In this case, the isotropic etching removes crystal damage which was produced as a result of the grinding and which can impair both the electrical properties of the later component and the fracture stability of the wafer.

After the conclusion of this method, the first dielectric layers 31 are uncovered in the region of the second side of the first semiconductor body 100. The reference symbol 102 in FIG. 1D and in the following Figures designates the second side of the first semiconductor body 100 after the reduction of the thickness of the first semiconductor body 100. During this "thinning" of the first semiconductor body 100, the second semiconductor body 200 serves for mechanically stabilizing the entire semiconductor body structure. It should be pointed out in this connection that the vertical dimensions of the first and second semiconductor bodies 100, 200 in FIGS. 1C and 1D are not true to scale. The dimensions of the second semiconductor body 200 in a vertical direction can, in particular, be greater than those of the first semiconductor body 100.

The semiconductor structure with the two semiconductor bodies 100, 200 is referred to hereinafter as semiconductor body for short. This semiconductor body can be used as a basic structure for the realization of a power semiconductor component. In this case, the first sections 11' can form drift zones of the later power semiconductor component and the second sections 21' can form drift control zones of the later power semiconductor component, which will be additionally explained below. The dimensions of the dielectric layers 31 in a vertical direction of the composite semiconductor body or the dimensions of the first sections 11' influence the electrical properties of such a power semiconductor component. Per 100 volts of desired voltage blocking capability of the later component, approximately a thickness of 10 μm of the first sections 11' in a vertical direction is required if silicon is used as semiconductor material. It should be noted in this connection that, in order to set these electrical properties, the first semiconductor body 100 can be thinned or eroded until a desired vertical dimension of the first sections 11' is reached. During this process, therefore, the first dielectric layers 31 can also be partly eroded in a vertical direction.

The first semiconductor body 100 can be a homogeneously doped semiconductor substrate composed of a monocrystalline semiconductor material. However, it can also have differently doped semiconductor layers. Thus, by way of example, the region of the first semiconductor body 100 in which the first 31—and if appropriate second 32—dielectric layers are arranged can be doped differently than the subsequently eroded section of the first semiconductor body 100— to be precise both with regard to the doping concentration and with regard to the doping type.

Figure 2A:
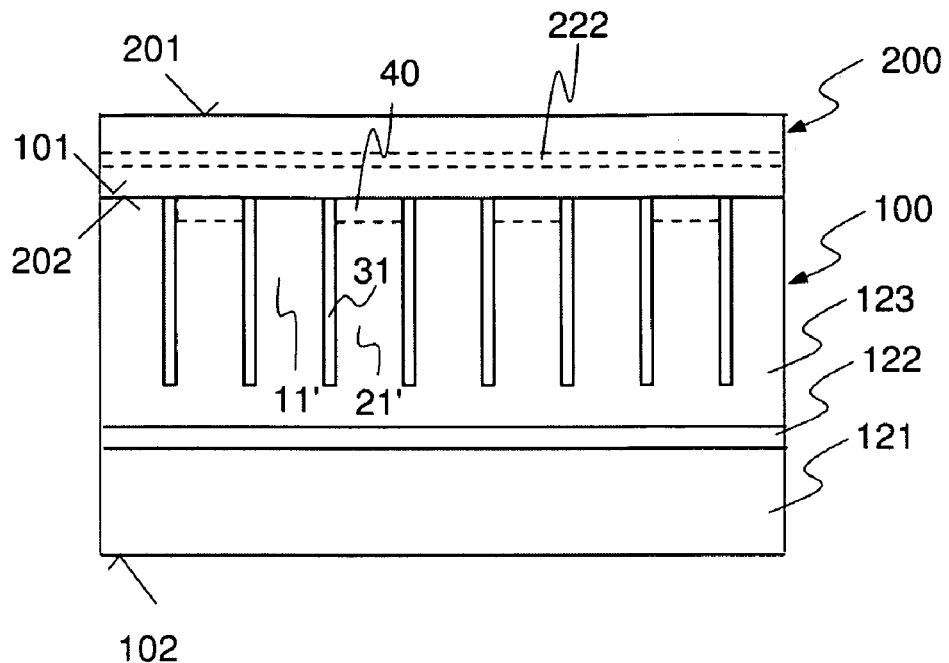
FIG. 2 illustrates one embodiment of a method for producing a semiconductor component structure.
Figure 2B:
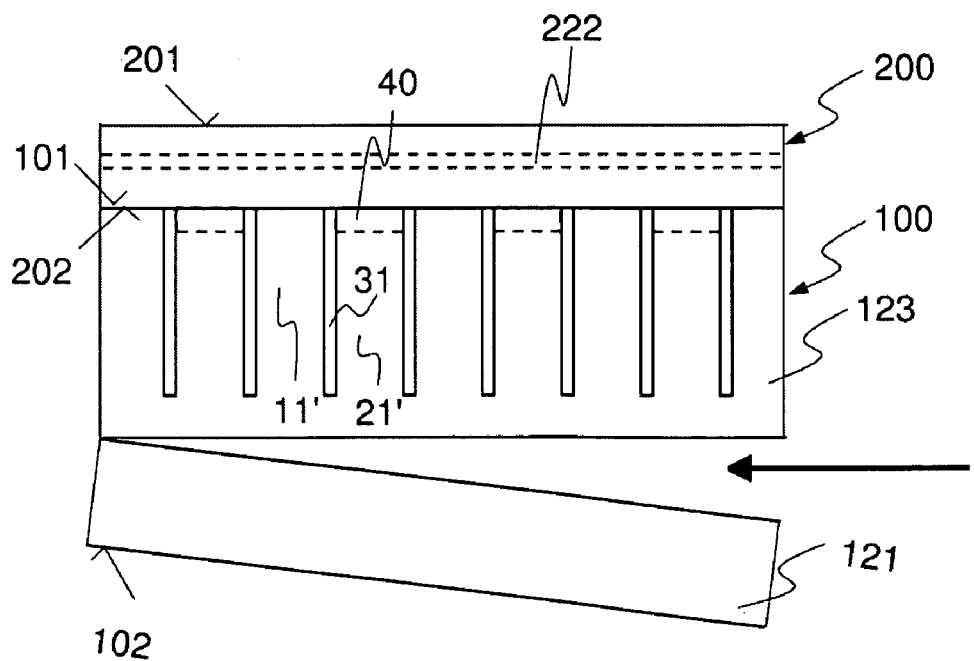

FIGS. 2A and 2B illustrate processes of a further example of a method for producing a semiconductor component structure in accordance with FIG. 1D. In this example, the semiconductor body 100 has three semiconductor layers: a first semiconductor layer 121; a second semiconductor layer 122, which is arranged on the first semiconductor layer 121 and which is a porous semiconductor layer; and a third semiconductor layer, which is applied to the porous semiconductor layer 122 and in which the dielectric layers 31 are arranged. The first and third semiconductor layers 121, 123 are, in particular, monocrystalline semiconductor layers. As an alternative and in a departure from the illustration in FIGS. 2A and 2B, individual or all of the dielectric layers 31 can also be realized in such a way that they reach as far as the porous second semiconductor layer 122 or right into the porous second semiconductor layer 122.

The first semiconductor layer 121 is a semiconductor substrate, for example, which can be doped as desired. The third semiconductor layer 123 is an epitaxial layer, for example, which was produced by epitaxial deposition on the porous semiconductor layer 122. Methods for producing an epitaxial layer on a porous semiconductor layer and methods for producing a porous semiconductor layer on a semiconductor substrate are known in principle, such that further explanations in this respect can be dispensed with.

In order to reduce the thickness of the first semiconductor body 100, referred to FIG. 2B, firstly the first semiconductor layer 121 is separated along the porous semiconductor layer 122. This separation of the first semiconductor layer 121 is effected, for example, by wet-chemical etching of the porous layer 122 in a lateral direction. Porous semiconductor material, such as e.g., porous silicon, has a significantly higher etching rate than crystalline semiconductor material, such as e.g., crystalline silicon. The difference in the etching rate between porous and crystalline material is between 10 000:1 and 100 000:1. Etchants contain, for example, hydroxide ions in solutions or dilute hydrofluoric acid in conjunction with an oxidizing medium (e.g., solutions containing HF and HNO₃). On account of the high etching rate, even at the wafer level, that is to say when an entire wafer with a multiplicity of semiconductor bodies of identical type is processed, the first semiconductor layer 121 can be removed within a short time, e.g., within a few minutes, by laterally etching the porous semiconductor layer 122. As an alternative to an etching method, the porous semiconductor layer 122 can also be separated or removed or eroded in a lateral direction, using a laser beam or water jet, to an extent such that the first semiconductor layer 121 can be removed.

On the basis of the removed first semiconductor layer 121, a new first semiconductor body can be produced by applying, after cleaning the surface, a new porous semiconductor layer to the semiconductor layer 121 and a new epitaxial layer to the porous semiconductor layer, first dielectric layers being produced in the epitaxial layer. In contrast to reducing the thickness of the first semiconductor body 100 using an etching method or a grinding method, the removed semiconductor material can be reused in this method.

Referring to FIGS. 2A and 2B, the dielectric layers 31 can be produced in such a way that they end within the third semiconductor layer 123 in a vertical direction. In a manner corresponding to the processes explained above with reference to FIG. 1D, the third semiconductor layer 123 can be eroded after the removal of the first semiconductor layer 121 using an etching method, a grinding method or a polishing method until at least the dielectric layers 31 are uncovered or until desired vertical dimensions of the first sections 11' and second sections 21' are reached. If the dielectric layers 31 are produced, in accordance with the alternative explained, in such a way that they reach as far as or right into the porous second semiconductor layer, then a planarization of the surface uncovered after the removal of the porous semiconductor layer 122 is sufficient. This planarization can include grinding, polishing or isotropic etching.

In a manner corresponding to the first semiconductor body 100, the second semiconductor body 200 can also be constructed in layered fashion, and include a porous semiconductor layer 222 (illustrated by dashed lines in FIGS. 2A and 2B). The porous layer 222 makes it possible also to separate parts of the second semiconductor body 200 in the same way; e.g., after carrying out further process processes, after the conclusion thereof, the mechanical stability of the semiconductor body structure can be reduced. A partial eroding of the second semiconductor body 200 is expedient, for example, when the second semiconductor body 200 serves as a connection zone, such as e.g., drain zone, of a later power semiconductor component. By reducing the thickness of the second semiconductor body 200, it is possible to reduce the electrical resistance of the connection zone. The reduction of the thickness, particularly if the porous semiconductor layer 222 is dispensed with, can also be effected by conventional grinding and/or etching.

Any suitable methods can be used for producing the vertical dielectric layers 31. These methods should be suitable for producing vertical dielectric layers 31 which—depending on the desired voltage blocking capability of the later power semiconductor component—extend into the first semiconductor body 100 a few μm to a few 100 μm in a vertical direction, and whose thickness is between 50 nm and 200 nm, for example. Examples of possible methods for producing such deep and thin vertical dielectric layers are explained below with reference to FIGS. 5 to 8. In these methods, the first semiconductor body 100 can be either a monocrystalline semiconductor body or a semiconductor body with a porous semiconductor layer (cf. FIG. 2).

Figures 5A, 5B:
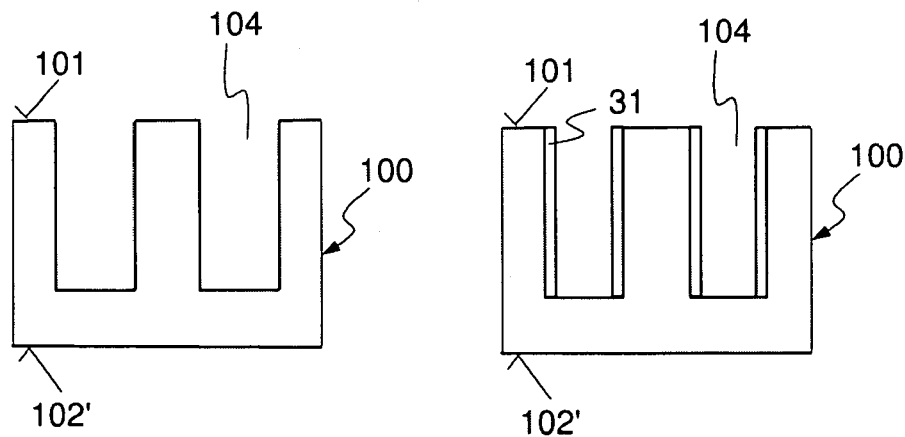
FIG. 5 illustrates a first method for producing vertical dielectric layers in a semiconductor body.

In a first method, referring to FIG. 5A, trenches 104 are produced in the first semiconductor body 100 proceeding from the first side 101. The depth of the trenches corresponds to the desired dimensions of the first dielectric layers 31 in a vertical direction of the first semiconductor body 100. Referring to FIG. 5B, the first dielectric layers 31 are subsequently produced at opposite sidewalls of the trenches 104. Producing the dielectric layers 31 includes, for example, producing a dielectric layer over the whole area at the sidewalls of the trenches, the bottoms of the trenches and on the first side 101 of the first semiconductor body 100. This whole-area dielectric layer can be produced, for example, by deposition of a dielectric layer or by thermal oxidation. The dielectric layer is subsequently removed at least from the bottoms of the trenches, for example, using an anisotropic etching method, which results in the structure illustrated in FIG. 5B. On the first side 101 of the semiconductor body, the dielectric layer can be removed again, as is illustrated in FIG. 5, or a dielectric layer can still remain there (not illustrated).

Figure 5C:
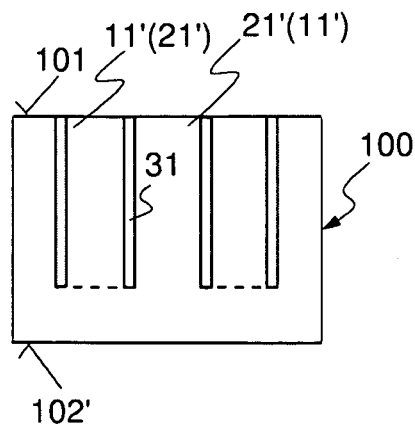

Referring to FIG. 5C, the residual trenches remaining after the dielectric layers 31 have been produced are filled by deposition of an epitaxial layer proceeding from the bottoms of the trenches. Semiconductor material that grows onto the first side 101 during this method is subsequently eroded, for example, using a grinding or polishing method.

In a method wherein a dielectric layer still remains on the first side 101 of the semiconductor body, the dielectric layer prevents semiconductor material from growing on the first side 101. All that then occurs is a growth of semiconductor material proceeding from the trenches both in a vertical and in a lateral direction. During later processes wherein the first side 101 is planarized after deposition of the semiconductor material, the dielectric layer present on the first side 101 can serve as a stop layer for a grinding or polishing method during the planarization.

The result of the processes explained above is a monocrystalline semiconductor body 100 having first dielectric layers 31 extending in a vertical direction. A boundary between the semiconductor material of the originally provided semiconductor body 100 into which the trenches 104 were etched, and the epitaxial layers produced later is illustrated by dashed lines in FIG. 5C. In this first semiconductor body 100, first sections 11' can be the epitaxial layers, but can also be the mesa sections that remained between the trenches 104 during the production of the trenches 104 (cf. FIG. 5A). The reference symbols not indicated between parentheses in FIG. 5C relate to the first case; the reference symbols indicated between parentheses in FIG. 5C relate to the second case.

The width of the trenches 104 in a lateral direction and the mutual distance between the trenches are dependent on the desired dimensions of the later first sections 11' and second sections 21' in a lateral direction. In this case, the width of the trenches determines the lateral dimensions of one of the first sections 11' and the second sections 21', and the mutual distance between the trenches 104 determines the lateral dimensions of the other of the first sections 11' and the second sections 21'. The width of the trenches is, for example, between 0.2 μm and 5 μm, in particular between 0.4 μm and 2 μm. The mutual distance between the trenches can lie within the same range, but can also be larger.

The geometry of the trenches 104 is dependent on the desired geometry of the first sections 11' and second sections 21'. If the intention is to produce strip-type first sections 11' and second sections 21' (cf. FIG. 3), then the trenches 104 are elongated trenches at the opposite sidewalls of which the first dielectric layers 31 are produced. In order to produce the second dielectric layers 32 (cf. FIG. 3D), dielectric layers are also produced at end walls of the elongated trenches 104. With application of the method explained above, the production of these second dielectric layers 32 can take place together with the production of the first dielectric layers 31. If the second dielectric layer 32 is intended to delimit both the first sections 11', and the second sections 21' with respect to the edge region 104, then a further trench has to be produced which runs in a lateral direction perpendicular to the trenches 104 and in which a dielectric layer that forms the second dielectric layer 32 is produced at least at a sidewall. If the intention is to produce pillar-type second sections 21' and first sections 11', as was explained with reference to FIG. 4, then in the method in accordance with FIG. 5 pillar-type trenches 104 have to be produced proceeding from the first side 101 of the first semiconductor body 100.

Figure 6A:
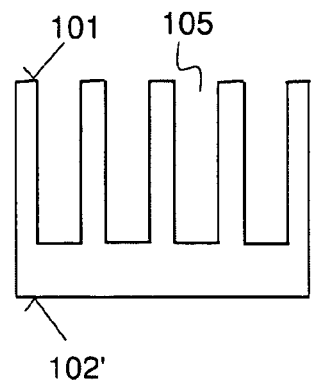
FIG. 6 illustrates one embodiment of a method for producing vertical dielectric layers in a semiconductor body.
Figure 6B:
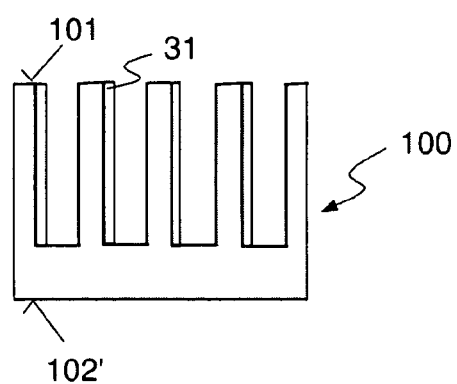
Figure 6C:
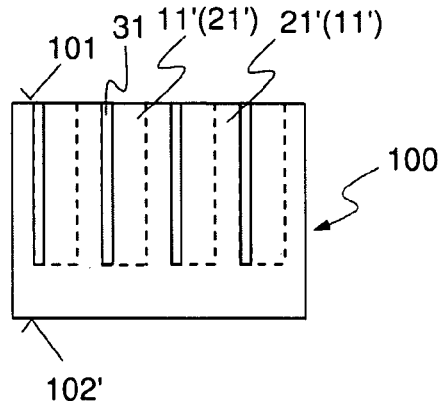

A further embodiment for producing vertical dielectric layers is explained below with reference to FIGS. 6A to 6C. Referring to FIG. 6A, this method provides for producing vertical trenches 105 extending into the first semiconductor body 100 proceeding from the first side 101. Afterward, referring to FIG. 6B, a dielectric layer is produced at only respectively one sidewall of a trench. These dielectric layers form the first dielectric layers 31. These dielectric layers are produced, for example, by whole-area application of a dielectric layer to uncovered surfaces of the first semiconductor body 100 after the production of the trenches 105 and subsequent removal of these dielectric layers from the first side 101, the bottom and one of the sidewalls of the trenches 105. Afterward, the residual trenches remaining after the production of the first dielectric layers 31 are filled by epitaxial deposition of a semiconductor material using an epitaxy method proceeding from the sidewalls not covered by the dielectric layers 31 to the bottoms of the trenches 105. On the first side 101 of the semiconductor body, the dielectric layer can either be removed, as is illustrated, or a dielectric layer can still remain there (not illustrated). In this case, the doping concentration of the epitaxially produced semiconductor material is chosen in particular such that it is similar to the doping concentration of the first semiconductor body 100 in the region in which the trenches 105 were produced, taking account of the process fluctuations. During production of the first dielectric layers 31 and of the first sections 11' and of the drift second sections 21' in accordance with this method, the first sections 11' and the second sections 21' are doped approximately identically.

In the method explained above with reference to FIG. 5 there is the possibility of the first sections 11' and the second sections 21' being doped differently by virtue of the fact that in the epitaxy method explained, a semiconductor material is deposited whose doping concentration and, if appropriate, doping type differ from the doping of the first semiconductor body 100 in the region in which the trenches 104 were produced.

Figure 7A:
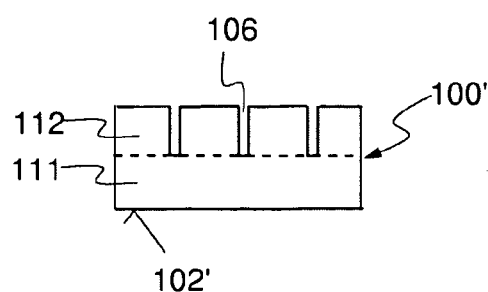
FIG. 7 illustrates one embodiment of a method for producing vertical dielectric layers in a semiconductor body.
Figure 7B:
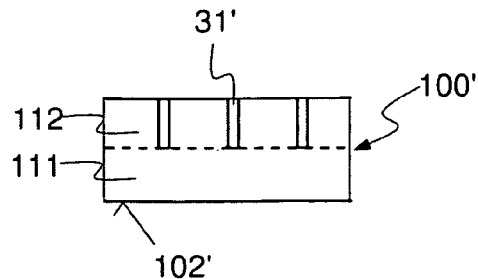
Figure 7C:
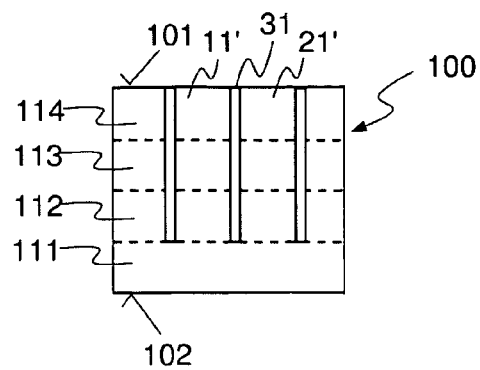

A further embodiment of a method for producing the vertical dielectric layers 31 is illustrated in FIGS. 7A to 7C. In this method, in order to produce the first semiconductor body 100, a plurality of epitaxial layers are deposited successively, in which case, after each epitaxial layer has been produced, trenches 106 are produced in the epitaxial layer deposited, which is illustrated for an epitaxial layer 112 in FIG. 7A. Referring to FIG. 7B, the trenches 106 are subsequently filled with a dielectric, whereby vertical dielectric sections 31' arise which form part of the later first dielectric layers 31. The trenches in the individual epitaxial layers are in each case produced in a manner lying one above another such that individual vertical dielectric sections 31' are adjacent to one another in a vertical direction, whereby the first dielectric layers 31 arise. FIG. 7C illustrates the first semiconductor body 100 after the conclusion of this method. It shall be assumed merely for explanation purposes that in this method three epitaxial layers 112, 113, 114 are deposited one above another, in each of which trenches are produced that are filled with a dielectric material. It goes without saying that the number of epitaxial layers produced one above another can be as desired. It should be noted in this context that the trenches produced first (cf. FIG. 7A) can also be produced directly in a semiconductor substrate, that is to say that before the production of these first trenches an epitaxial layer need not necessarily be applied to the semiconductor substrate. If an epitaxial layer is applied to a semiconductor substrate before the production of the first trenches, the trenches 106 can be produced in such a way that they reach through the epitaxial layer right into the semiconductor substrate. In FIG. 7A, the reference symbol 111 designates a semiconductor substrate and the reference symbol 112 designates an epitaxial layer deposited first on the semiconductor substrate.

It should furthermore be noted that the vertical dielectric sections (31' in FIG. 7B) which are adjacent to one another in a vertical direction of the first semiconductor body 100 can directly form the first dielectric layers 31. Furthermore, there is also the possibility, after the last epitaxial layer has been deposited, of removing the previously produced dielectric layers from the trenches, for example, using an etching method, and replacing them by another dielectric layer, for example, using thermal oxidation. The same also applies to the methods explained above with reference to FIGS. 5 and 6.

In the method explained with reference to FIG. 7, the dimensions of the produced trenches 106 in a lateral direction of the semiconductor body correspond to the desired dimensions of the first dielectric layer 31, in which case it should be taken into account, if appropriate, that in the case where the first dielectric layers 31 are produced using thermal oxidation, the thickness of the dielectric layers 31 produced is larger than the width of the previously produced trenches 106.

Figure 8A:
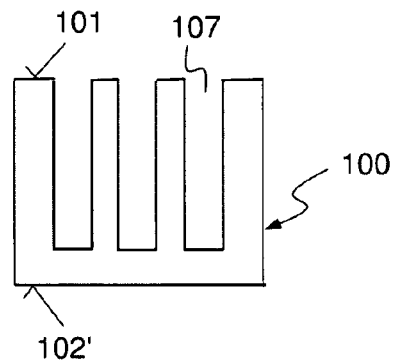
FIG. 8 illustrates one embodiment for producing vertical dielectric layers in a semiconductor body.
Figure 8B:
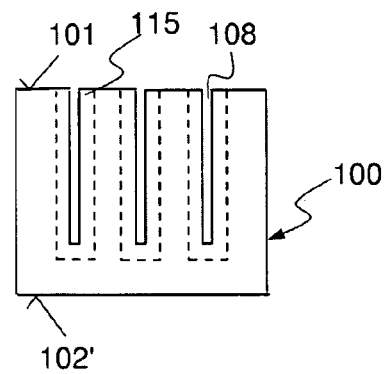
Figure 8C:
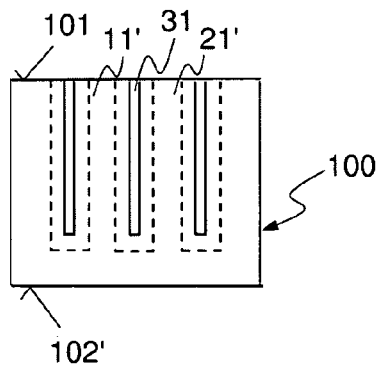

In a further embodiment of a method for producing vertical dielectric layers, referring to FIG. 8A, firstly trenches 107 are produced which extend into the first semiconductor body 100 in a vertical direction proceeding from the first side 101 but whose dimensions in a lateral direction of the semiconductor body are larger than a desired thickness of the later first dielectric layers 31. Referring to FIG. 8B, the trenches 107 are subsequently partly filled using an epitaxy method proceeding from the bottom and from the sidewalls until residual trenches 108 remain. These residual trenches are subsequently filled with the dielectric desired for the vertical dielectric layers, the result of which is illustrated in FIG. 8C. The process of filling the trenches with the dielectric material is effected, for example, by thermal oxidation or by deposition of a dielectric layer into the residual trenches 108.

It should be pointed out that the methods for producing the vertical dielectric layers explained with reference to FIGS. 5 to 8 are to be understood merely as an example. It goes without saying that any further methods can be employed for producing the vertical dielectric layers 31 in the first semiconductor body 100.

The dielectric properties of the dielectric layer 31 can change, and in particular deteriorate, during the processes explained, for example, during the epitaxy methods. It may be expedient, therefore, to remove this dielectric layer 31 after or during the method processes explained, e.g., using etching, and to produce it anew. Producing the dielectric layer 31 anew can include a thermal oxidation and/or the deposition of one or a plurality of dielectric layers. The newly produced dielectric layer 31 can be produced as a homogeneous layer, but can also be produced in such a way that it has a layer sequence of different dielectric materials. Such dielectric materials are, for example, $SiO_2$, $Si_3N_4$, $Al_2O_3$, $HfO_2$, $TiO_2$ or other dielectrics used for gate insulations in integrated circuits, either in pure or mixed form or as a layer sequence of the pure and/or mixed forms.

The semiconductor body structure in accordance with FIG. 1D including the first semiconductor body 100 containing the vertical dielectric layers 31, and the second semiconductor body 200 applied to the first semiconductor body 100 directly or indirectly, can be used as a basic structure for the production of vertical power semiconductor components. In such vertical power semiconductor components drift zones 11 of the semiconductor component are formed in the first sections 11', and drift control zones 21 are formed in the second sections 21'. In connection with producing such vertical semiconductor components first sections 11' will be referred to as drift zone sections, and second sections 11' will be referred to as drift control zone sections.

Figure 9:
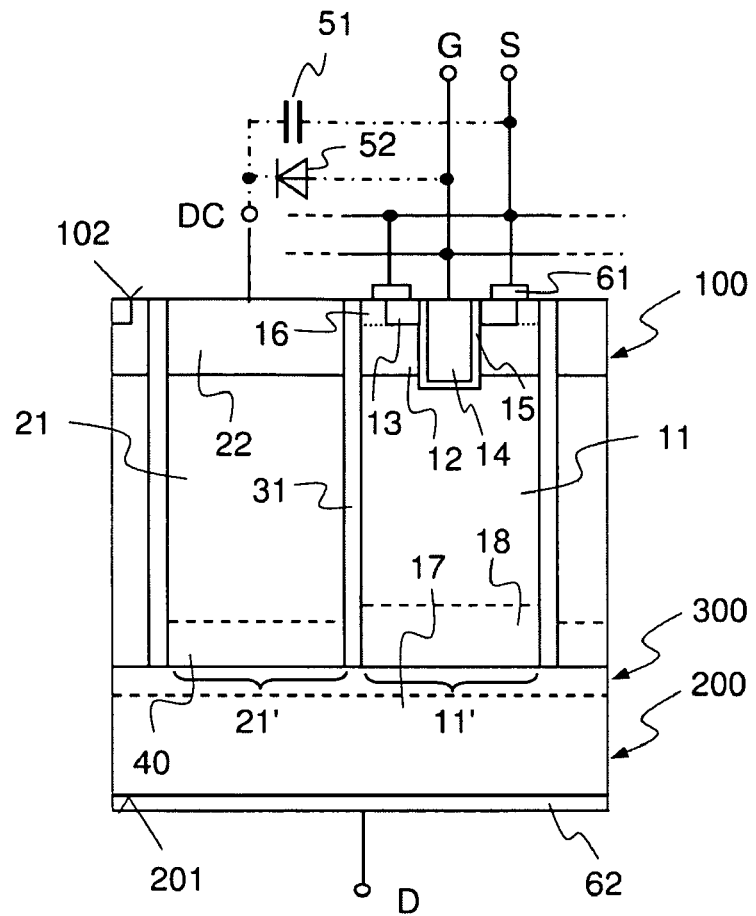
FIG. 9 illustrates one embodiment of a semiconductor component on the basis of a vertical cross section through a semiconductor body structure.

FIG. 9 illustrates a vertical cross section of a vertical power semiconductor component which is embodied as a MOS transistor and is based on such a basic structure in accordance with FIG. 1D. FIG. 9 illustrates only one drift zone section 11' and drift control zone section 21' of this basic structure. It goes without saying that the component can have a multiplicity of such drift zone sections 11' and drift control zone sections 21'.

The first semiconductor body 100, the second semiconductor body 200, and if appropriate the interlayer 300 form a semiconductor body. The second side 102 of the first semiconductor body 100 that is obtained by reducing the thickness of the first semiconductor body 100 is referred to hereinafter as front side of this semiconductor body, and the first side 201 of the second semiconductor body 200 is referred to hereinafter as rear side of this semiconductor body.

The semiconductor component includes a respective transistor cell in each drift zone section 11', the transistor cell being arranged in the region of the front side 102. The transistor cell includes a body zone 12, which is arranged in the region of the front side 102 in the drift zone section 11'. The body zone 12 is produced, for example, by implantation and/or diffusion of dopant atoms proceeding from the front side 102. The dopant atoms are chosen in particular in such a way that the body zone 12 is doped complementarily with respect to the drift zone section 11' in which it is produced. The residue—remaining after production of the body zone 12—of the drift zone section 11', which in the example illustrated reaches in a vertical direction as far as the end of the first dielectric layers 31, forms a drift zone 11 of the component. The transistor cell additionally includes a source zone 13, which, for example, is of the same conduction type as the drift zone 11 but doped more highly than the drift zone 11. The source zone 13 is separated from the drift zone 11 by the body zone 12. The source zone 13 is produced, for example, by implantation and/or diffusion of dopant atoms into the body zone 12 proceeding from the front side 102. The transistor cell additionally includes a gate electrode 14, which is arranged adjacent to the body zone 12 and which is dielectrically insulated from the body zone 12 by a gate dielectric 15. In the example illustrated, the gate electrode 14 is arranged in a trench that extends through the source zone 13 and the body zone 12 right into the drift zone 11. The illustrated transistor cell including the gate electrode 14 arranged in a trench is also referred to as a trench transistor cell.

The source zone 13 can be arranged at a distance from the first dielectric layer 31 in a lateral direction, but can also reach as far as the dielectric layer 31.

In addition, as illustrated in dotted fashion in FIG. 9, a contact zone 16 can be arranged laterally between the body zone 12 and the connection contact 61 for the source and body zone, which is of the same conductivity type as the body zone 12 but doped more highly. The contact zone 16 can also be situated below the source zone 13 in sections, but must not, at least at all points, reach as far as the gate dielectric 15. The source zone 13 can extend laterally as far as the dielectric layer 31, the contact zone 16 then being situated behind and/or in front of the source zone 13 relative to the plane of the drawing illustrated. The source zone 13 and the contact zone 16 can be situated over the entire length between the trench with the gate electrode 14 and the dielectric layer 31, but can also be introduced into the semiconductor body in sections, e.g., in insular or strip-type fashion.

In the region of the front side 102, in the case of the component illustrated, at least locally a semiconductor zone 22 is present in the drift zone section 21', the semiconductor zone being doped, for example, complementarily with respect to a basic doping of the drift control zone section 21'. The semiconductor zone 22 forms a connection zone of a drift control zone 21, wherein the drift control zone 21 is formed by that section of the drift control zone section 21' which remains after the production of the connection zone 22. In a vertical direction of the semiconductor body, the connection zone 22 can extend, proceeding from the front side 102, into the semiconductor body to just the same extent as the adjacent body zone 12. The connection zone 22 and the body zone 12 can be produced, for example, by a common implantation and/or diffusion method. It should be pointed out in this context that the connection zone 22 and the body zone 12 can also be produced by separate methods and need not necessarily extend into the semiconductor body to an identical extent. The drift zone 11 and the drift control zone 21 can be of the same conduction type and can have, in particular, identical doping concentrations.

In the case of the semiconductor component illustrated in FIG. 9, the second semiconductor body 200, which makes contact with the drift zone 11, forms a drain zone of the MOS transistor structure. The drain zone is common to all the transistor cells of the component. The individual transistor cells are connected in parallel, moreover, by their source zones 13 being electrically conductively connected to one another and connected to a common source connection S, and by their gate electrodes 14 being electrically conductively connected to one another and connected to a common gate connection G. In the region of the rear side 201, a metallization 62 can be applied to the second semiconductor body 200 forming the drain zone 14, the metallization forming a drain connection D of the component. Apart from the source connection S, the gate connection G and the drain connection D, the component illustrated has a fourth connection, namely a drift control zone connection DC connected to the connection zone 22.

A further drain zone section 18 can optionally be present in the drift zone section 11' in the transition region with respect to the interlayer 300 or the second semiconductor body, the further drain zone section being formed by a semiconductor region that is doped more highly than the drift zone 11. The drain zone section 18 can be produced by implantation or indiffusion of dopant atoms before the interlayer 300 or the second semiconductor body 200 is applied.

The functioning of the component illustrated in FIG. 9 is explained below. It shall be assumed for explanation purposes that the MOS transistor structure is a transistor structure of a normally off n-conducting MOSFET. In this case, the source zone 13, the drift zone 11 and the drain zone 17 are n-doped, while the body zone 12 is p-doped. It shall additionally be assumed that the drift control zone 21 is of the same conduction type as the drift zone 11, that is to say n-doped in the example, and that the connection zone 22 is doped complementarily with respect to the drift control zone 21. It should be pointed out in this context that the following explanation also applies to a p-conducting MOSFET, in which case the doping types of the component zones mentioned above should be interchanged and the polarities of the voltages explained below should be interchanged.

The component is turned on if a positive voltage is present between the drain connection D and the source connection S and if an electrical potential suitable for forming an inversion channel in the body zone 12 along the gate dielectric 14 between the source zone 13 and the drift zone 11 is present at the gate connection G. In the case of an n-conducting MOSFET, the electrical potential is an electrical potential which is positive with respect to the potential of the source connection S and which lies above the source potential at least by the value of a threshold voltage of the transistor. In addition, with the component driven in the on state, the drift control zone 21 is charged to an electrical potential suitable for forming an accumulation channel in the drift zone 11 along the dielectric layer 31. In the case of an n-doped drift zone 11, an electrical potential of the drift control zone 21 that is positive with respect to the drift zone 11 is necessary for forming such an accumulation channel. In order to provide this electrical potential of the drift control zone 21, the drift control zone connection DC can be coupled to the gate connection G.

For driving the component in the on state, the electrical potential of the gate connection G lies, for example, between 5 V and 20 V above the electrical potential at the source connection S. With the component driven in the on state, the voltage drop across the drift zone 11, that is to say the voltage difference between the drain zone 17 and the source zone 13, is, for example, between 1 V and 3 V, or else less. Even at the drain-side end of the drift zone 11, the potential difference between the drift control zone 21 at gate potential and the drift zone 11 still suffices to produce an accumulation channel along the dielectric layer 31.

The insulation structure 40 explained in even greater detail below ensures, while the component is driven in the on state, that the drift control zone 21 can be held at an electrical potential that is higher than the electrical potential of the drain zone 17 and the drift zone 11. With the component driven in the on state, therefore, the insulation structure 40 prevents a discharge of the drift control zone 21 in a direction of the drain zone 17.

Figure 10:
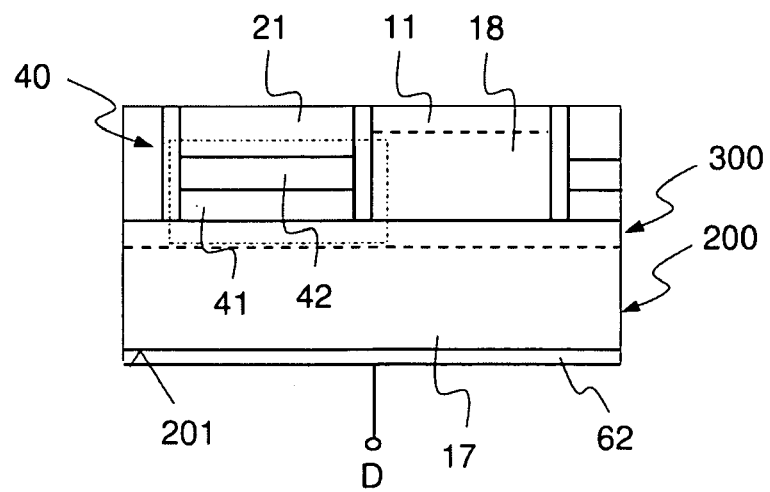
FIG. 10 illustrates one embodiment of an insulation structure of a semiconductor component.

Referring to FIG. 10, one example provides for realizing the insulation structure 40 as a junction insulation structure having a pn junction. This insulation structure 40 has at least one semiconductor zone 41 doped complementarily with respect to the drain zone 17. This complementarily doped semiconductor zone 41 can be directly adjacent to the drift control zone 21. In this case, a pn junction that prevents a discharge of the drift control zone 21 in a direction of the drain zone 17 is formed between the drift control zone 21 and the first semiconductor zone 41. There is optionally the possibility of providing, between the first semiconductor zone 41 and the drift control zone 21, a more highly doped semiconductor zone 42 (illustrated in dashed fashion) of the same conduction type as the drain zone 17.

The insulation structure illustrated in FIG. 10 with the at least one semiconductor zone 41 doped complementarily with respect to the drain zone 17 is produced, for example, by dopant atoms being implanted or indiffused into the drift zone section 21 via the first side 101 of the first semiconductor body 100 before the second semiconductor body 200 is applied. The optional drain zone section 18 of the same doping type as the drain zone 17 can be produced analogously. After this insulation structure 40 has been produced, a plane surface of the first semiconductor body 100 is present in the region of the first side 101. In this case, the second semiconductor body 200 can be bonded directly onto the first side 101, such that an interlayer 300 can be dispensed with. Optionally, however, such an interlayer 300 can also be provided when an insulation structure 40 in accordance with FIG. 10 is realized. The interlayer is illustrated in dashed fashion in FIG. 10.

In order to form a positive electrical potential in the drift control zone 21 with the component driven in the on state, holes are required in an n-doped drift control zone 21. In the case of the component illustrated in FIG. 9, the holes are made available from the connection zone 22 doped complementarily with respect to the drift control zone 21. In order that electrical charge required in the drift control zone 21 with the component driven in the on state does not have to be made available anew with each switching operation of the component, a storage capacitance 51, such as e.g., a capacitor, is optionally connected to the drift control zone connection DC, which, in the example illustrated, is connected between the drift control zone connection DC and the source connection S but can also be connected between the drift control zone connection DC and a reference potential connection. The capacitor 51 serves for storing the electrical charge required in the drift control zone 21 with the component driven in the on state in the event of the component being turned off, and can be integrated in the semiconductor body and/or realized outside the latter. If the electrical charge of the drift control zone 21 is made available via the gate connection G, then in this case a rectifier element, for example, a diode 52, is connected between the gate connection G and the drift control zone connection DC. The rectifier element 32 prevents the capacitance 51 from being discharged with the component driven in the off state, that is to say when the gate connection G is at a low electrical potential in the case of an n-conducting MOSFET.

The component is turned off if a positive voltage is present between the drain connection D and the source connection S and if the electrical potential at the gate connection G does not suffice to produce a conducting channel in the body zone 12. In this case, proceeding from the pn junction between the body zone 12 and the drift zone 11, a space charge zone or depletion layer zone propagates in the drift zone 11 in a direction of the drain zone 17. In this space charge zone, the electrical potential increases proceeding from the electrical potential of the body zone 12, which is short-circuited with the source zone 13 via the source electrode 61, in a direction of the drain zone 17. A corresponding space charge zone also propagates in the drift control zone 21 when the component is turned off. It should be noted in this context that the drift zone 11 and the drift control zone 21 are doped and chosen with regard to the semiconductor structure of the semiconductor material used for realizing these component zones in such a way that a space charge zone can propagate. By virtue of the space charge zones propagating in parallel fashion in the drift zone 11 and the drift control zone 21 when the component is turned off, the voltage loading of the dielectric layer 31 is comparatively small. The dielectric layer 31 can thereby be realized in very thin fashion, that is to say significantly thinner than a dielectric layer that would be necessary in order to be able to take up the entire voltage present between drain D and source S when the component is turned off. In this case, for a given electrical potential of the drift zone 21, the formation of an accumulation channel in the drift zone 11 with the component driven in the one state is all the more pronounced, the thinner the dielectric 31.

In a departure from the explanations above, there is also the possibility of doping the drift zone 11 in such a way that it is of the same conduction type as the body zone 12. In this case, with the component driven in the on state, an inversion channel propagates along the dielectric layer 31 in the drift zone 11. In the case of an n-conducting MOSFET, the drift zone is therefore p-doped in this case. Independently of the doping type, the doping concentration of the drift zone depends on the required blocking capability of the component with the nominal reverse voltage $V_{nominal}$. In this case, the magnitude of the doping of the drift zone $N_{drift}$ of a component, at least in the vicinity of the blocking pn junction, is intended approximately to satisfy the condition $$N_{drift} \leq \frac{2 \cdot 10^{17} V \cdot cm^{-3}}{V_{nominal}}$$

preferably to be approximately less than or equal to half the value obtained after insertion of the reverse voltage. For a nominal reverse voltage of 600 V, for example, this results in an upper limit for the magnitude of the doping of approximately $3 \cdot 10^{14}/cm^3$, and in this case the doping chosen is in particular lower than approximately $1.5 \cdot 10^{14}/cm^3$. If the drift zone 11 is of the same conduction type as the body zone 13 and if the gate dielectric 15 is arranged at a distance from the dielectric layer 31 as in the example illustrated in FIG. 9, such that the inversion channels that form in the body zone 13 along the gate dielectric 15 and in the drift zone 11 along the dielectric layer 31 are at a distance from one another, then between the accumulation dielectric 15 and the dielectric layer 31 below the body zone 13 at least locally a semiconductor zone doped complementarily with respect to the body zone 13 and the drift zone 11 can be provided (not illustrated), which connects the two channels.

Figure 11:
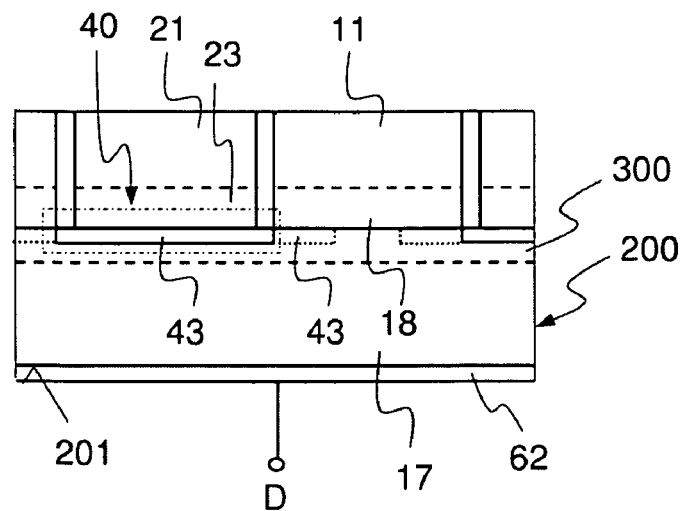
FIG. 11 illustrates one embodiment of the insulation structure.

FIG. 11 illustrates a further embodiment of an insulation structure 40 on the basis of an excerpt from the semiconductor component illustrated in FIG. 9. This insulation structure 40 has a dielectric layer 43 between the drift control zone 21 and the drain zone 17. The drift control zone 21 is thereby completely dielectrically insulated from the drain zone 17 at its drain-side end. The dielectric layer 43 can be realized in such a way that it reaches in a lateral direction precisely as far as the first dielectric layers 31—and if appropriate the second dielectric layers 32 (cf. FIG. 3)—which delimit the drift control zone 21 in a lateral direction. However, the dielectric layer 43 can also partly overlap the adjacent drift zones 11, which is illustrated by dotted lines in FIG. 11.

Figure 12A:
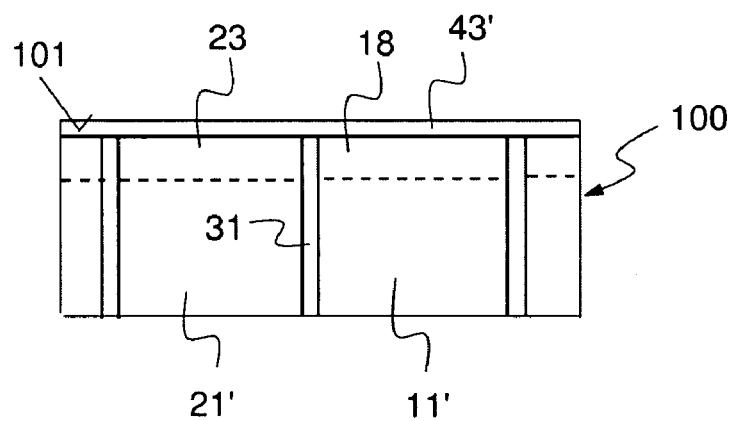
FIG. 12 illustrates one embodiment of a method for producing the insulation structure in accordance with FIG. 11.
Figure 12B:
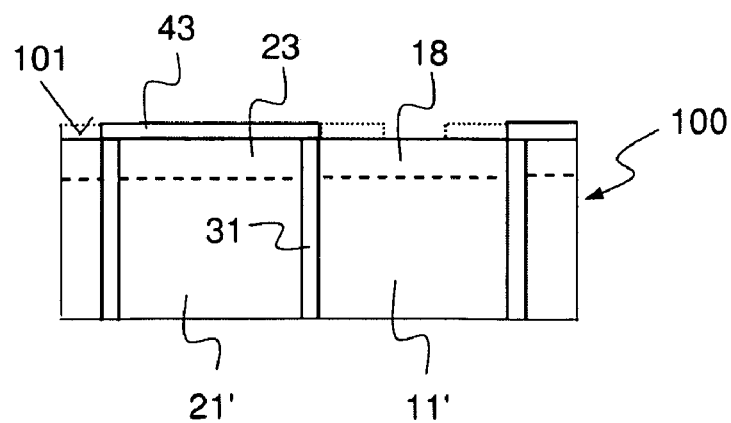

One embodiment of a method for producing the dielectric layer 43 in the context of the processes explained with reference to FIGS. 1 and 2 is explained below with reference to FIGS. 12A to 12D. Referring to FIG. 12A, during processes, a dielectric layer 43' is produced over the whole area on the first side 101 of the first semiconductor body 100. The dielectric layer 43 is produced, for example, by thermal oxidation or by deposition of a dielectric layer. In this case, the dielectric layer 43' can be produced at the same point in time as the dielectric layers 31. Referring to FIG. 12B, the dielectric layer 43' is subsequently patterned in such a way that it covers at least the drift control zone sections 21', in which case the dielectric layer 43 can also partly cover the drift zone sections 11'. The dielectric layer 43' is patterned, for example, using an etching method using an etching mask having cutouts above the drift zone sections 11', such that the dielectric layer 43' is removed at least in sections above the drift zone sections 11'.

Figure 12C:
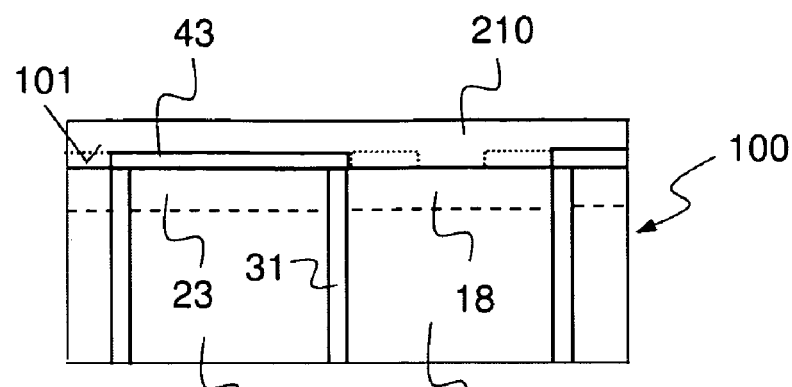

Referring to FIG. 12C, an interlayer 300 is subsequently applied to the dielectric layer 43 and the uncovered regions of the drift zone sections 11'. The interlayer 300 is composed, for example, of a highly doped polycrystalline or amorphous semiconductor material, such as silicon, for example, and serves to provide a plane surface onto which the second semiconductor body 200 can be bonded. In a manner not illustrated in more specific detail, in this case there is the possibility, in particular, of etching back, grinding back or polishing back the interlayer 300 after the deposition thereof until it attains the required planarity, or in the extreme case to an extent such that the interlayer only fills voids between the dielectric layers 43 above the drift zone section 11'.

Figure 12D:
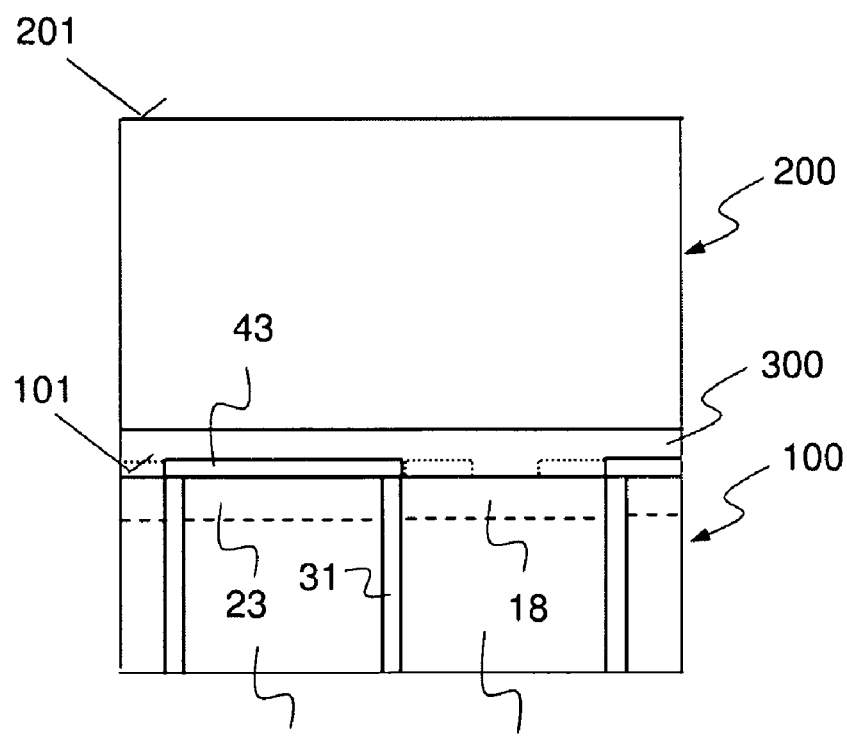

Referring to FIG. 12D, the second semiconductor body 200 is subsequently applied to the interlayer 300.

If an interlayer 300 is produced, then its doping type is chosen in such a way that it forms part of the drain zone 17 of the semiconductor component. The optionally present drain zone section 18 can be produced by indiffusion of dopant atoms from the interlayer 300 into the drift zone section 11'. In this case, the interlayer 300 serves as a dopant source for producing the drain zone section 18. As an alternative or in addition, the drain zone section 18 can also be produced prior to the application of the second semiconductor body 200 by ion implantation and/or diffusion.

In the case of the semiconductor component illustrated in FIG. 9, the second semiconductor body 200—if appropriate together with the interlayer 300 and the optionally present drain zone section 18—forms a drain zone of the component. It should be pointed out in this context that before the completion of the component, that is to say before the application of the drain electrode 32, the thickness of the semiconductor body 200 can also be reduced in order to reduce the electrical resistance thereof. The thickness can be reduced, for example, by grinding back, etching back, polishing or by a combination of these processes, or else by—as explained—part of the semiconductor body 200 being separated along a porous semiconductor layer.

A further embodiment provides for completely removing the second semiconductor body 200 again after completion of the component structures in the region of the front side 102 of the semiconductor body and then applying the drain electrode 62 to the interlayer 300. In the case of such a component, exclusively the interlayer 300, if appropriate together with the drain zone section 18, forms the drain zone or rear-side connection zone of the component.

Figure 13A:
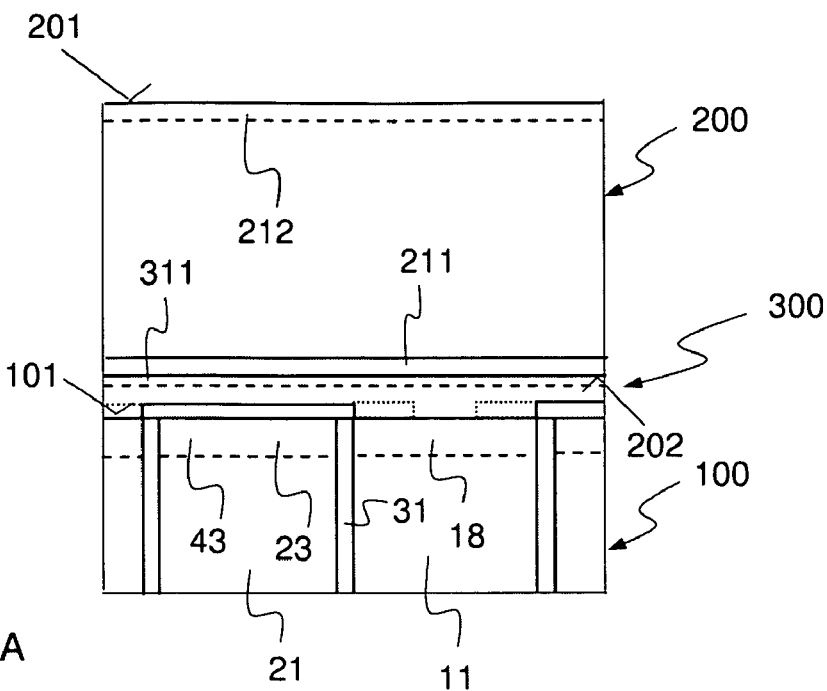
FIG. 13 illustrates a further method for producing a semiconductor component structure including a drift zone, a drift control zone and a dielectric layer.

A method for completely removing the second semiconductor body 200 is explained below with reference to FIGS. 13A to 13D. This method uses a second semiconductor body 200 having an auxiliary layer 211, e.g., an oxide layer 211, at least in the region of its second side 202. Such an auxiliary layer 211 can be produced, for example, by thermal oxidation of the semiconductor body 200. In this case, an oxide layer 212 is also present in the region of the first side 201 of the semiconductor body. Before the second semiconductor body 200 is applied to the first semiconductor body 100 or the interlayer 300, either a further oxide layer is applied to the interlayer 300 or the interlayer 300 is partly oxidized in regions near the surface by thermal or chemical oxidation. The reference symbol 311 designates such an oxide layer 311 that is deposited or produced by a thermal or chemical oxidation. The second wafer 200 is subsequently applied to the interlayer 300 by the two oxide layers 211, 311 being put together and the semiconductor body structure thus obtained being heated, whereby the two oxide layers 211, 311 combine with one another. Optionally, one of the oxide layers 211, 311 or both of the oxide layers 211, 311 is or are polished before being joined together. FIG. 13A illustrates the semiconductor body structure obtained using this method.

Figure 13B:
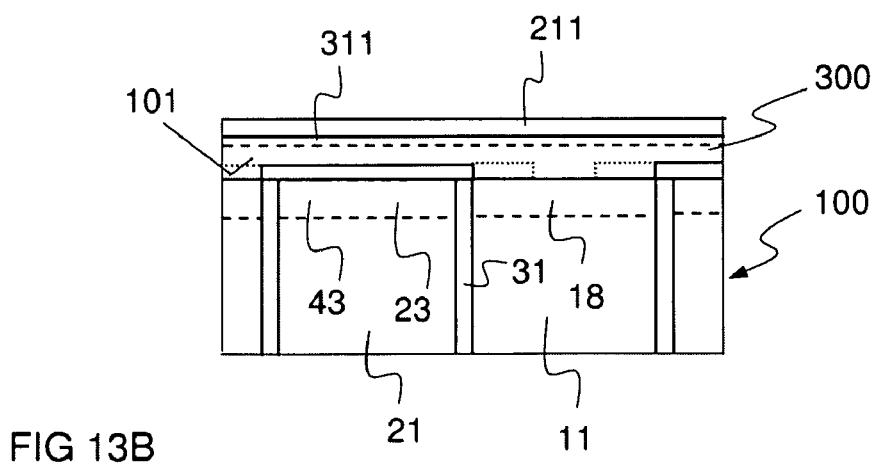

Referring to FIG. 13B, the second semiconductor body 200 is subsequently removed as far as the level of the oxide layer 211. This removal of the second semiconductor body 200 can be effected using an etching method in which the oxide layer 211 serves as an etching stop layer. There is also the possibility of grinding back the semiconductor body 200 and subsequently etching it back as far as the level of the oxide layer 211. The second semiconductor body 200 can also have a porous semiconductor layer 222 (illustrated in dashed fashion in FIG. 13A) along which parts of the second semiconductor body 200 are separated before a residue of the second semiconductor body is etched back as far as the level of the oxide 211.

Figure 13C:
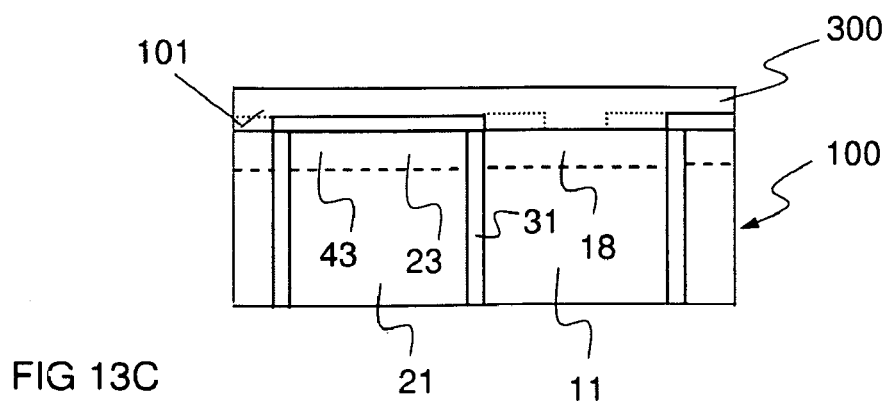

Referring to FIG. 13C, the two oxide layers 211, 311 are subsequently removed, for example, using an etching method in which the interlayer 300 serves as an etching stop layer.

Figure 13D:
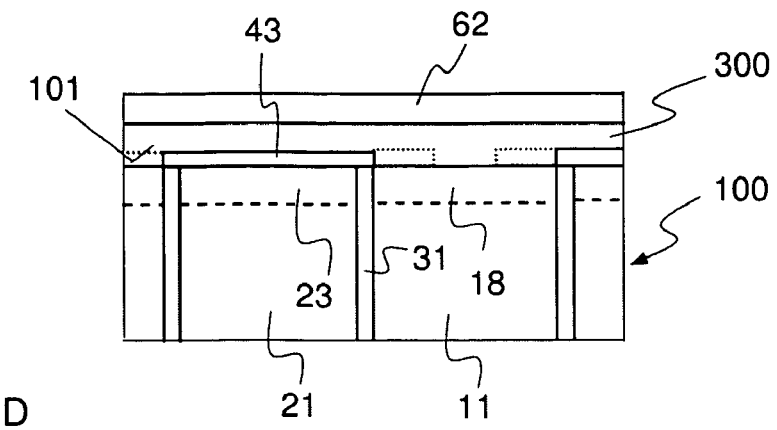

Referring to FIG. 13D, a metallization 62 can subsequently be applied to the interlayer 300, the metallization forming a drain electrode of the later component.

Figure 14:
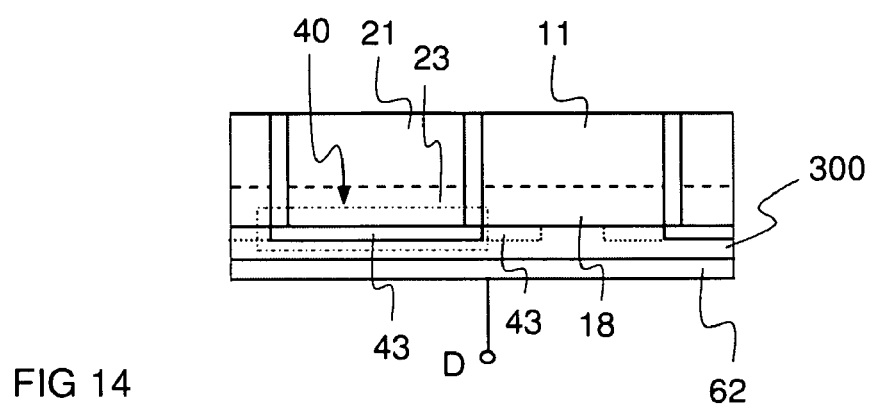
FIG. 14 illustrates an excerpt from a semiconductor component produced by the method in accordance with FIG. 13.

FIG. 14 illustrates an excerpt from a semiconductor component in accordance with FIG. 9 in which the second semiconductor body 200 is completely eroded and in which the drain zone is formed by the interlayer 300 and the optionally present drain zone section 18. In particular mono- or polycrystalline or amorphous semiconductor materials such as silicon are suitable as material for the interlayer 300 since the interlayer is exposed over the entire production process to temperatures of the cell and thus correspondingly high temperatures. In principle, however, correspondingly temperature-resistant metal-semiconductor compounds such as silicides or else highly temperature-resistant metals are also suitable.

In the case of a dielectric insulation of the drift control zone 21 from the drain zone, which is achieved when an insulation structure in accordance with FIG. 11 is used, there is the risk of charge carriers which cannot flow away accumulating in the drift control zone 21. In the case of an n-doped drift control zone 21, when the component is turned off, electrons and holes can be generated on account of thermal charge carrier generation within the drift control zone 21, the holes being conducted away via the first connection zone 22, while the electrons remain in the drift control zone 21 and can negatively charge the drift control zone 21 in the long term. In the case of an insulation structure 40 in accordance with FIG. 10, the electrons can flow away via the pn junction in a direction of the drain zone 14.

Figure 15:
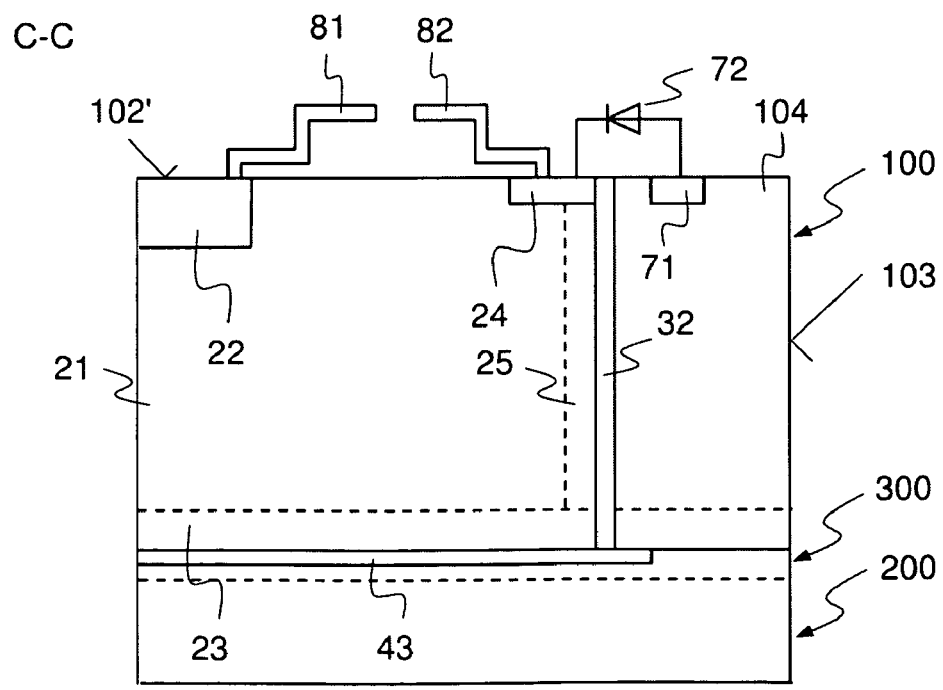
FIG. 15 illustrates an example of a semiconductor component including a drift control zone that is dielectrically insulated from a connection zone, and including a rectifier element between the connection zone and the drift control zone in the edge region of a semiconductor body.

In order to prevent such charging of the drift control zone 21 when a dielectric layer 43 is provided between the drift control zone 21 and the drain zone, referring to FIG. 15, the drift control zone 21 can be connected to the drain zone via a rectifier element 72, such as a diode, for example, in the region of the edge of the semiconductor body at the front side 102. FIG. 15 illustrates a semiconductor component in accordance with FIG. 9 for the case where the component has strip-type drift zones 11 and drift control zones 21, in the edge region of the semiconductor body in a sectional plane C-C illustrated in FIG. 3B. In the case of this component, the drain zone is formed by the interlayer 300 and/or the second semiconductor body 200 and is insulated from the drift control zone 21 by the dielectric layer 43.

In the region of the front side 102, the edge region 104 of the semiconductor body is at the same electrical potential as the rear side, that is to say the drain potential. This is owing to the fact that the space charge zone, in the off-state case, is laterally delimited by the edge termination and the edge region 104 is thus free of electric fields and thus conductive in accordance with its doping. Moreover, a multiplicity of lattice defects are present along the edge 103, the defects bringing about a sufficient conductivity of the semiconductor body along the edge even via possibly existing and severed pn junctions. The lattice defects result from the division, for example, sawing apart, of a wafer into the individual semiconductor bodies. In FIG. 15, the reference symbol 32 designates the dielectric layer that has already been explained with reference to FIG. 3B and insulates the drift control zone 21 from the edge region 104 of the semiconductor body. The connection zone 22 of the drift control zone 21 ends at a distance from the edge region 104 or at a distance from the dielectric layer 32 in a lateral direction of the semiconductor body. Referring to the explanations concerning FIG. 9, when the component is turned off, the connection zone 22 of the drift control zone 21 is at an electrical potential that is significantly lower than the drain potential. When the component is turned off, the edge region 104 is thus at drain potential, while the connection zone 22 is at a significantly lower potential. The rectifier element 72 is connected between a connection zone 71 of the edge region 104 and a further connection zone 24 of the drift control zone 21. In the example illustrated, the further connection zone 24 is directly adjacent to the dielectric layer 32, but can also be arranged at a distance from the dielectric layer 32 (not illustrated). Via the rectifier element 72, this second further connection zone 24 is approximately at drain potential when the component is turned off. On account of the potential difference between the connection zone 22 and the further connection zone 24 when the component is turned off, a space charge zone forms in the drift control zone 21 in a lateral direction, and takes up the voltage difference. In order to influence the electric field, field plates 81, 82 can be provided, of which one is connected to the connection zone 22 and one is connected to the further connection zone 24. As an alternative to the structure illustrated in FIG. 15, the field plate 82 can also be connected directly to the drain potential. The connection of the field plate 82 to the connection zone 24 is then separated and the field plate 82 is e.g., electrically connected to the connection zone 71.

The rectifier element 72 serves to conduct away accumulated charge carriers, that is to say electrons in the case of an n-doped drift control zone 21, from the drift control zone 21. For this purpose, it is necessary for the rectifier element 72 not to be connected with low impedance to all regions of the drift control zone 21. Optionally, however, a semiconductor zone 23 doped more highly than the drift control zone 21 is present, which extends in a lateral direction along the dielectric layer 43 and which ensures that the drift control zone 21, at its drain-side end, that is to say at the end facing the drain zone or the dielectric layer 43, is at an identical electrical potential at all points. Optionally, there is furthermore the possibility of connecting the more highly doped zone 23 to the connection zone 24 using a further more highly doped zone 25, which extends along the dielectric layer 32. These two more highly doped zones 23, 25 ensure that the drain-side end of the drift control zone 21, with the component driven in the off state, is approximately at drain potential (more precisely: at drain potential minus the forward voltage of the rectifier element 72).

Figure 16:
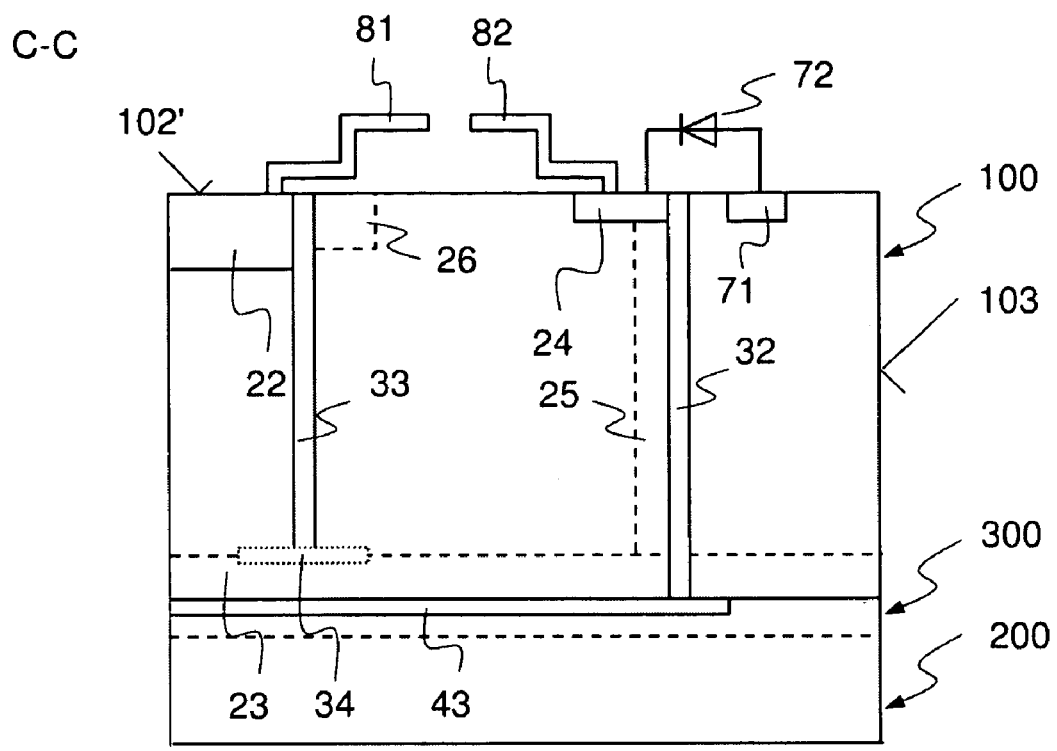
FIG. 16 illustrates a semiconductor component modified relative to the example in accordance with FIG. 15.

It should be pointed out that instead of the edge termination with field plates illustrated symbolically in FIGS. 15 and 16, other edge terminations known in principle are also possible e.g., on the basis of field rings, partially or fully depletable dopings (VLD edges, variation of lateral doping), coverings with insulating, semi-insulating or electroactive layers such as e.g., DLC (Diamond Like Carbon) also in combination or in combination with field plates.

The rectifier element 72 can be realized as a diode, in particular, and must not have a particularly high voltage blocking capability in the reverse direction but rather prevent at least the flowing over of accumulation charge from the drift control zone 21 in a direction of the drain. In order, however, to prevent the charge carriers accumulated in the drift control zone 21, that is to say holes in the case of an n-doped component, from flowing away via the rectifier element 72 with the component driven in the on state, the connection zone 24 can be doped very highly.

Optionally, referring to FIG. 16, there is the possibility of providing within the drift control zone 21 a dielectric layer 33 reaching from the front side 102 as far as the more highly doped semiconductor zone 23 at the drain-side end of the drift control zone 21. The dielectric layer 33 prevents the charge carriers that have accumulated when the component is turned on from being able to propagate in a lateral direction as far as the connection zone of the rectifier element 72. Charge carriers thermally generated in the off-state case can be conducted away from the drift control zone 21 via the more highly doped semiconductor zone 23. A space charge zone also propagates laterally in the off-state case, but the space charge zone ends at the latest at the connection zone 24. In this space charge zone, electron-hole pairs are likewise formed using thermal generation and separated using the electric field. While one charge carrier species—the electrons in this example—can flow away via the connection zone 24 in a direction of the drain, the carriers of the other charge carrier species—the holes in this example—accumulate at the top at the further dielectric layer 33 and are trapped. Optionally, therefore, a semiconductor zone 26 doped complementarily with respect to the drift control zone is provided adjacent to the further dielectric layer 33 at the side remote from the connection zone. The semiconductor zone 26 is electrically connected to the source potential in a manner not illustrated and likewise serves for conducting away thermally generated charge carriers.

Optionally, there is additionally the possibility of providing an additional dielectric layer 34 perpendicular to the further dielectric layer 33 along the more highly doped layer 23, the additional dielectric layer projecting beyond the dielectric layer 33 toward both sides in a lateral direction.

It should be pointed out that, in the case of the semiconductor component explained with reference to FIGS. 15 and 16, any desired rear-side connection zone can be provided which forms the drain zone or at least parts of the drain zone of the semiconductor component. In a manner already explained above, the connection zone can comprise, for example, only the second semiconductor body, the interlayer 300 and the second semiconductor body 200 or only the interlayer 300, if appropriate in each case in conjunction with a metallization 62.

Figure 17:
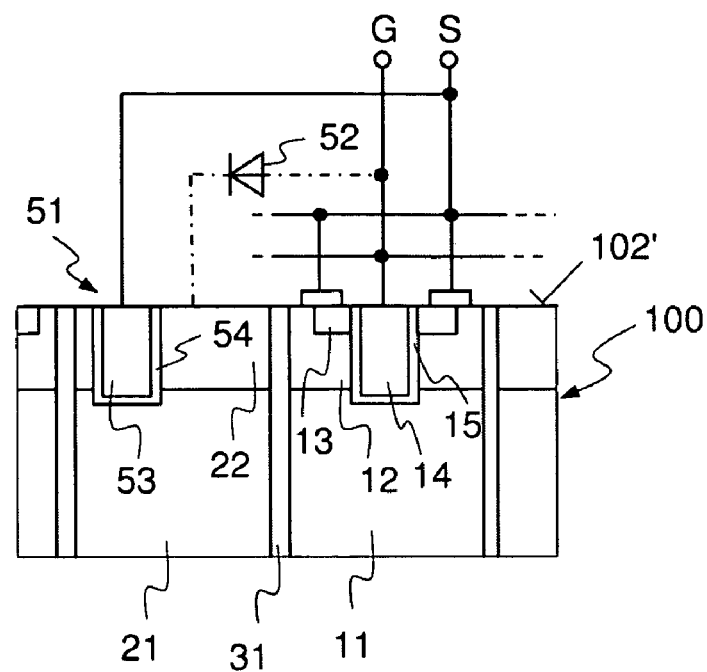
FIG. 17 illustrates the integration of a capacitance in the region of the drift control zone of a semiconductor component.

The rectifier element 72 in accordance with FIGS. 15 and 16 and also the capacitive storage element 51 and the rectifier element 52 in accordance with FIG. 9 can be realized as external components, but some or all of these components can also be integrated in the semiconductor body. FIG. 17 illustrates an example for the integration of the capacitive storage element 51 within the semiconductor body. In the example illustrated, the capacitive storage element 51 is integrated in the region of the drift control zone 21 and includes a first capacitance electrode 53, which is insulated from the drift control zone 21 and the connection zone 22 using a capacitance dielectric 54. In this case, the first capacitance electrode 53 is connected to the source connection S, for example. In this case, the connection zone 22 does not have to be situated over the entire length of the drift control zone 21 or does not have to be situated only in regions in which the storage element 51 is situated. In particular, the connection zone 22 can also be situated only in those regions of the drift control zone 21 in which no storage element 51 is realized. In contrast to FIG. 17, it is also possible for a plurality of storage elements 51 to be realized in a drift control zone 21.

Figure 18:
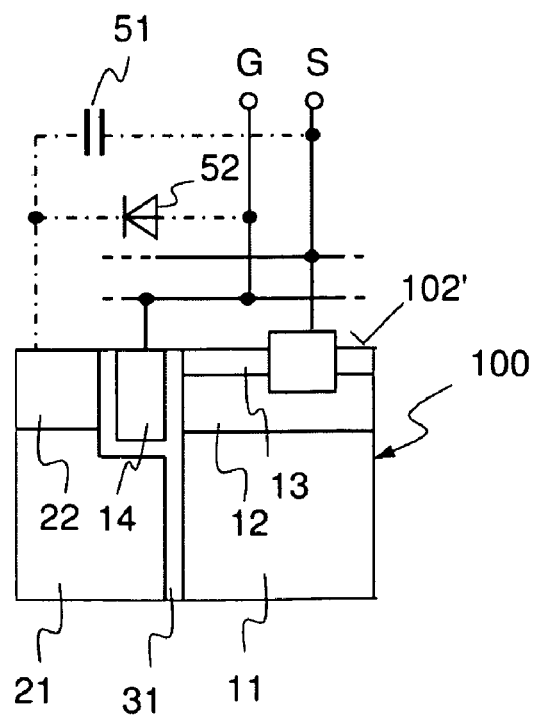
FIG. 18 illustrates one embodiment of a transistor cell of a semiconductor component.

It should be pointed out that any desired transistor cell geometries can be provided for the component. The component is therefore not restricted to the transistor cell geometry explained with reference to FIG. 9. Referring to FIG. 18, there is also the possibility, for example, of arranging the gate electrode 14 in the region of the drift control zone 21. In this case, the dielectric layer 31 has the function of an accumulation dielectric for the accumulation of charge carriers in the drift zone 11 under the control of the drift control zone 21 and the function of the gate dielectric 15.

It should additionally also be pointed out that the dielectric layer 31 can be made thicker in the region of the body zone 12 than in the region of the drift zone 11 or drift control zone 21. Such a thickening can be achieved e.g., by a procedure in which the dielectric layer 31, proceeding from the surface 102' of the semiconductor body, is removed right into a depth of the body zone 12 or somewhat deeper using an etching process and afterward, for example, a thermal oxidation is carried out or a dielectric layer is deposited. As an alternative, after the removal of the upper part of the dielectric layer 31, the semiconductor material can also be etched back and the resulting wider trench can be filled with dielectric again.

The basic structure or semiconductor body that has been obtained by the processes explained with reference to FIGS. 1 and 2 and that has semiconductor zones that are separated by dielectric layers is, of course, not restricted to be used as a basis for producing power semiconductor components that have drift zones and drift control zones. This basic structure may be used in connection with any semiconductor component or semiconductor circuit that requires vertical dielectric layers.

Figures 19, 20:
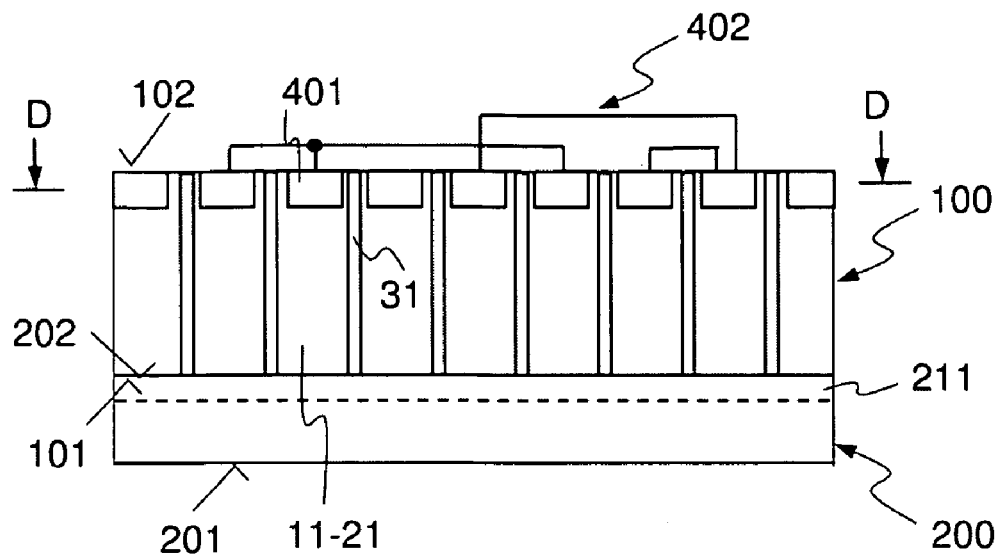
FIG. 19 illustrates one embodiment of a semiconductor circuit on the basis of a vertical cross section through a semiconductor body.
FIG. 20 illustrates one embodiment of a semiconductor circuit on the basis of a horizontal cross section through a semiconductor body.

Referring to FIG. 19 this basic structure may serve as a basis for a semiconductor circuit that has a number of semiconductor devices or sub-circuits 401 that within the semiconductor body are dielectrically insulated against each other by the first dielectric layers 31. These devices or sub-circuits 401 are formed in separate semiconductor sections and are interconnected using one or more interconnection layers 402 that are disposed above the second side 201. In this connection it should be noted that in FIGS. 1 to 8 that relate to methods for producing the basic structure different reference numbers (11', 21') for these semiconductor sections have been chosen in order to ease understanding use of this basic structure for the production of a power semiconductor component as explained with reference to FIG. 9 even though these semiconductor sections do not necessarily differ from each other. In FIGS. 19 and 20 reference number 11-21 in general denotes the semiconductor sections that are obtained by subdividing the first semiconductor body 100 using first dielectric layer(s) 31.

In FIG. 19 the devices or sub-circuits 401 and the interconnection layer are illustrated only schematically. It should be mentioned, that the devices 401 or sub-circuits may include any kind of semiconductor components and that these devices or sub-circuits 401 may be interconnected in any way.

In one embodiment the basic structure includes first and second semiconductor bodies 100, 200 that directly adjoin each other. In this case a basic doping of first semiconductor body 100, in which the devices or sub-circuits 401 are formed, and a basic doping of second semiconductor body 200 are complementary so as to form pn-junctions between the different devices or sub-circuits in a vertical direction. Instead of providing different dopings of first and second semiconductor body 100, 200 these semiconductor bodies may have a same doping type. In this case complementarily doped semiconductor regions (not illustrated) can be produced in the first semiconductor body 100 in the region of its first side prior to applying the second semiconductor body 200.

In one embodiment (illustrated in dashed lines) an electrically insulating layer, like an oxide layer, is disposed on the semiconductor sections 11', 21' on the first side 101 of the first semiconductor body. In this case, the devices or sub-circuits are completely dielectrically insulated against each other in the semiconductor body. This insulating layer 221 may be produced by oxidizing first and/or second semiconductor body 100, 200 prior to bonding the two semiconductor bodies together.

Referring to FIG. 20 first semiconductor layers 31 may form a grid that separates a number of semiconductor sections 11', 21' in a lateral direction from each other, with the devices or sub-circuits 401 being formed in these semiconductor sections 1.

Finally, it should be pointed out that features which were explained above in connection with only one example can be combined with features of other examples even if this was not explicitly mentioned. Thus, in particular features of the claims specified below can be combined with one another as desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor structure comprising:
providing a first semiconductor body having a first and a second side, the first semiconductor body having a plurality of first dielectric layers being arranged at a distance from one another, each extending into the first semiconductor body proceeding from the first side in a vertical direction, and subdividing the first semiconductor body into semiconductor sections;
applying a second semiconductor body to the first side of the first semiconductor body; and
reducing a thickness of the first semiconductor body in a vertical direction proceeding from the second side at least as far as a level of the plurality of first dielectric layers.

2. The method for producing a semiconductor structure according to claim 1, wherein the first semiconductor body has a layer structure having at least a first semiconductor layer, a porous second semiconductor layer and a third semiconductor layer,
wherein the dielectric layers are arranged in the first semiconductor layer; and
wherein reducing the thickness of the first semiconductor body comprises separating the third semiconductor layer along the porous second semiconductor layer.

3. The method for producing a semiconductor structure according to claim 1, wherein reducing the thickness of the first semiconductor body comprises eroding the first semiconductor layer after removal the second semiconductor layer.

4. The method for producing a semiconductor structure according to claim 3, wherein eroding comprises an etching method or a grinding method.

5. The method for producing a semiconductor structure according to claim 1, wherein the semiconductor sections are subdivided in a group of drift zones and a group of drift control zones, with the plurality of first dielectric layers being arranged between the drift zones and the drift control zones.

6. The method for producing a semiconductor structure according to claim 5 further comprising, after reducing the thickness of the first semiconductor body:
producing at least one transistor component zone in each of the drift zone sections proceeding from the side uncovered after reducing the thickness of the first semiconductor body.

7. The method for producing a semiconductor structure according to claim 6 further comprising producing the following transistor component zones in the drift zone sections:
a source zone, a body zone and a drift zone, formed by the drift zone section remaining after the source zone and the body zone have been produced, wherein the body zone is arranged between the source zone and the drift zone; and
a gate electrode, arranged adjacent to the body zone and dielectrically insulated from the body zone by a gate dielectric.

8. The method for producing a semiconductor structure according to claim 5 further comprising, after reducing the thickness of the first semiconductor body, producing in each case at least one connection zone in the drift zone sections proceeding from the side uncovered after reducing the thickness of the first semiconductor body.

9. The method for producing a semiconductor structure according to claim 5 further comprising, prior to applying the second semiconductor body, producing a doped semiconductor layer in the drift zone sections and/or the drift control zone sections in the region of the first side of the first semiconductor body.

10. The method for producing a semiconductor structure according to claim 1, wherein the first semiconductor body has second dielectric layers extending into the first semiconductor body proceeding from the first side and arranged such that, together with the first dielectric layers, they completely enclose at least some of the semiconductor sections in a lateral direction of the first semiconductor body.

11. The method for producing a semiconductor structure according to claim 5, wherein prior to applying the second semiconductor body comprises producing insulation structures in the region of the first side on or in the drift control zone sections.

12. The method for producing a semiconductor structure according to claim 11, wherein producing the insulation structures comprises producing in each case a third dielectric layer on the first side of the first semiconductor body on the drift zone sections.

13. The method for producing a semiconductor structure according to claim 12, wherein producing the third dielectric layers comprises:

applying a dielectric layer to the first side of the first semiconductor body on the drift zone sections and the drift control zone sections; and producing contact holes in the dielectric layer above the drift zone sections.

14. The method for producing a semiconductor structure according to claim 12 further comprising, prior to applying the second semiconductor body, applying an electrically conductive layer to the second side of the first semiconductor body.

15. The method for producing a semiconductor structure according to claim 14, wherein the electrically conductive layer is a doped polycrystalline semiconductor layer.

16. The method for producing a semiconductor structure according to claim 12, wherein the first semiconductor body has an edge region, and wherein the method further comprises producing rectifier elements between the edge region of the first semiconductor body and the drift control zone sections in the region of the side uncovered after reducing the thickness of the first semiconductor body.

17. The method for producing a semiconductor structure according to claim 1, wherein the second semiconductor body is at least partly removed proceeding from a side remote from the first semiconductor body.

18. The method for producing a semiconductor structure according to claim 17, wherein the second semiconductor body is completely removed proceeding from a side remote from the first semiconductor body.

19. The method for producing a semiconductor structure according to claim 1 further comprising, prior to applying the second semiconductor body, producing insulation structures in the region of the first side on or in the semiconductor sections.

20. The method for producing a semiconductor structure according to claim 19, wherein producing the insulation structure comprises producing an electrically insulating layer on the first side.

* * * * *